US010879465B2

(12) United States Patent
Tseng et al.

(10) Patent No.: US 10,879,465 B2
(45) Date of Patent: Dec. 29, 2020

(54) METHOD FOR FORMING AN ORGANIC ELEMENT OF AN ELECTRONIC DEVICE

(71) Applicant: Merck Patent GmbH, Darmstadt (DE)

(72) Inventors: Hsin-Rong Tseng, Wiesbaden (DE); Thorsten Schenk, Glashuetten (DE); Peter Levermore, Darmstadt (DE); Anja Jatsch, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 16/481,616

(22) PCT Filed: Jan. 29, 2018

(86) PCT No.: PCT/EP2018/052098
§ 371 (c)(1),
(2) Date: Jul. 29, 2019

(87) PCT Pub. No.: WO2018/138318
PCT Pub. Date: Aug. 2, 2018

(65) Prior Publication Data
US 2019/0386218 A1 Dec. 19, 2019

(30) Foreign Application Priority Data
Jan. 30, 2017 (EP) .................................... 17153711

(51) Int. Cl.
*H01L 51/00* (2006.01)
*H01L 27/32* (2006.01)
(Continued)

(52) U.S. Cl.
CPC ...... *H01L 51/0005* (2013.01); *H01L 27/3211* (2013.01); *H01L 27/3244* (2013.01);
(Continued)

(58) Field of Classification Search
CPC ............. H01L 51/0003; H01L 51/0004; H01L 51/0005; H01L 27/3211; H01L 27/3246; H01L 27/322; H01L 21/02288
See application file for complete search history.

(56) References Cited

U.S. PATENT DOCUMENTS

2003/0137242 A1 7/2003 Seki
2012/0097933 A1* 4/2012 Ando .................. H01L 27/3218
257/40
(Continued)

FOREIGN PATENT DOCUMENTS

WO WO-2011015265 A2 2/2011
WO WO-2015135625 A1 9/2015

OTHER PUBLICATIONS

International Search Report for PCT/EP2018/052098 dated Apr. 17, 2018.
(Continued)

*Primary Examiner* — Jae Lee
(74) *Attorney, Agent, or Firm* — Faegre Drinker Biddle & Reath LLP

(57) ABSTRACT

The present invention relates to a method for forming an organic element of an electronic device having at least two different pixel types including a first pixel type (pixel A) and a second pixel type (pixel B) wherein at least one layer of the pixel A and one layer of pixel B are deposited by applying an ink at the same time, characterized in that the ink for manufacturing a layer for the pixel A and the ink for manufacturing a layer for the pixel B which are deposited at the same time are different and the layer obtained by depositing the ink for manufacturing a layer for the pixel A and the layer obtained by depositing the ink for manufacturing a layer for the pixel B are dried thereafter, wherein the relative difference of the drying time $(t_1-t_2/t_1)$ of both layers being deposited at the same time and being obtained by two
(Continued)

A device having a BCL structure different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$.

20 Claims, 4 Drawing Sheets

(51) Int. Cl.
    *H01L 51/50*     (2006.01)
    *H01L 51/56*     (2006.01)

(52) U.S. Cl.
    CPC ........ *H01L 27/3281* (2013.01); *H01L 51/506* (2013.01); *H01L 51/5076* (2013.01); *H01L 51/5092* (2013.01); *H01L 51/56* (2013.01)

(56) References Cited

U.S. PATENT DOCUMENTS

| | | | |
|---|---|---|---|
| 2014/0110701 A1* | 4/2014 | Noh | H01L 27/3246 257/43 |
| 2014/0335639 A1 | 11/2014 | Takashige | |
| 2017/0084844 A1 | 3/2017 | Parham et al. | |

OTHER PUBLICATIONS

International Search Report for PCT/EP2018/052099 dated May 16, 2018.
Written Opinion of the International Searching Authority for PCT/EP2018/052098 dated Apr. 17, 2018.
Written Opinion of the International Searching Authority for PCT/EP2018/052099 dated May 16, 2018.

* cited by examiner

A device having a BCL structure

A device having a side-by-side structure

Results of Example 1

| Photoluminescence Pixel A | |
|---|---|
|  | Figure 3a |
|  | Figure 3b |
|  | Figure 3c |
|  | Figure 3d |
|  | Figure 3e |

Vacuum dry curve used in Example 1

Schematic diagram of different ink volumes printed and dried together as mentioned in Example 2. (a) 160 pL B-HTL with 60 pL G-EML, and (b) 60 pL for both B-HTL and G-EML The film profile of Example 2

Schematic diagram of different ink volumes printed and dried together as mentioned in Example 3. (a) 160 pL B-HTL with 60 pL R-EML, (b) 60 pL B-HTL with 60 pL R-EML, (c) 260 pL B-HTL with 60 pL R-EML Film profile of R-EML, where red ink dries together with different ink volumes of B-HTL

METHOD FOR FORMING AN ORGANIC ELEMENT OF AN ELECTRONIC DEVICE

CROSS-REFERENCE TO RELATED APPLICATIONS

This application is a national stage application (under 35 U.S.C. § 371) of PCT/EP2018/0052098, filed Jan. 29, 2018, which claims benefit: of European Application No. 17153711.1, filed Jan. 30, 2017, both of which are incorporated herein by reference in their entirety.

TECHNICAL FIELD

The present invention relates to a method for forming an organic element of an electronic device.

BACKGROUND ART

Display manufacturers have great interest in organic light-emitting diodes (OLED) for display application. In particular, they are interested in ink-jet printed OLED TV due to its high potential for high performance and potential low manufacture cost. The advantage of using inkjet printing technique is the highly precise position and ink volume control and its potentially high throughput for mass production. The conventional panel contains at least red, green, and blue colours (R, G, and B). Usually, each colour has multilayered device structure. Preferably, it contains anode, hole-injection layer (HIL), hole transport layer (HTL), emissive layer (EML), hole blocking layer (HBL), electron transport layer (ETL), and cathode.

One of the main challenges in multi-layer printing is to identify and adjust the relevant parameters to obtain a homogeneous deposition of inks on the substrate coupled with good device performances. In particular, solubility of materials, physical parameters of the solvent (surface tension, viscosity, boiling point, etc.), printing technology, processing conditions (air, nitrogen, temperature, etc.) and drying parameters are characteristics which can drastically influence the pixel pattern and thus the device performances.

Technical Problem and Object of the Present Invention

Many solvents have been proposed in organic electronic devices for inkjet printing. However, the number of important parameters playing a role during deposition and the drying process makes the choice of the solvent very challenging. A further challenge is that prior art depositing methods may provide devices having a low efficiency and lifetime.

Therefore, it is an object of the present invention to solve the problems of the prior art as mentioned above. Furthermore, it is a permanent desire to improve the performance of the OE device, especially the layer(s) containing the organic semiconductor(s), such as efficiency, lifetime and sensitivity regarding oxidation or water.

Thus, the methods for forming an organic OE element such as semiconductors by inkjet printing still need to be improved. One object of the present invention is to provide a method for forming an organic OE element which allows a controlled deposition to form organic semiconductor layers having good layer properties and performance. A further object of the present invention is to provide a method for forming an organic OE element which allows an uniform application of ink droplets on a substrate when used in an inkjet printing method thereby giving good layer properties and performance.

SUMMARY OF THE INVENTION

The present invention relates to a method for forming an organic element of an electronic device having at least two different pixel types including a first pixel type (pixel A) and a second pixel type (pixel B) wherein at least one layer of the pixel A and one layer of pixel B are deposited by applying an ink at the same time, characterized in that the ink for manufacturing a layer for the pixel A and the ink for manufacturing a layer for the pixel B which are deposited at the same time are different and the layer obtained by depositing the ink for manufacturing a layer for the pixel A and the layer obtained by depositing the ink for manufacturing a layer for the pixel B are dried thereafter, wherein the relative difference of the drying time $(t_1-t_2/t_1)$ of both layers being deposited at the same time and being obtained by two different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$.

In addition thereto, the present invention relates to a kit of inks for performing a method for forming an organic element.

The invention further relates to an OE device obtainable by a method as described above and below.

The OE device includes, without limitation, organic field effect transistors (OFET), integrated circuits (IC), thin film transistors (TFT), Radio Frequency Identification (RFID) tags, organic light emitting diodes (OLED), organic light emitting electrochemical cells (OLEC), organic light emitting transistors (OLET), electroluminescent displays, organic photovoltaic (OPV) cells, organic solar cells (O-SC), flexible OPVs and O-SCs, organic laserdiodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electro-photographic devices, organic memory devices, biosensors and biochips.

According to a preferred embodiment, the present invention provides organic light emitting diodes (OLED). OLED devices can for example be used for illumination, for medical illumination purposes, as signalling devices, as signage devices, and in displays. Displays can be addressed using passive matrix driving, total matrix addressing or active matrix driving. Transparent OLEDs can be manufactured by using optically transparent electrodes. Flexible OLEDs are assessable through the use of flexible substrates.

Advantageous Effects of the Present Invention

The inventors have surprisingly found that a method for forming an organic element of an electronic device having at least two different pixel types including a first pixel type (pixel A) and a second pixel type (pixel B) wherein at least one layer of the pixel A and one layer of pixel B are deposited by applying an ink at the same time, characterized in that the ink for manufacturing a layer for the pixel A and the ink for manufacturing a layer for the pixel B which are deposited at the same time are different and the layer obtained by depositing the ink for manufacturing a layer for the pixel A and the layer obtained by depositing the ink for manufacturing a layer for the pixel B are dried thereafter, wherein the relative difference of the drying time $(t_1-t_2/t_1)$ of both layers being deposited at the same time and being obtained by two different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$ allows an effective ink deposition to form uniform and well-defined organic layers of functional materials which have good layer properties and very good performance.

The method and device of the present invention provides surprising improvements in the efficiency of the OE devices and the production thereof. Unexpectedly, the performance, the lifetime and the efficiency of the OE devices can be improved, if these devices are achieved by a method of the present invention.

In addition thereto, the method enables a low-cost and easy printing process. The printing processes allow a high quality printing at high speed.

DETAILED DESCRIPTION OF THE PRESENT INVENTION

Figure 1:
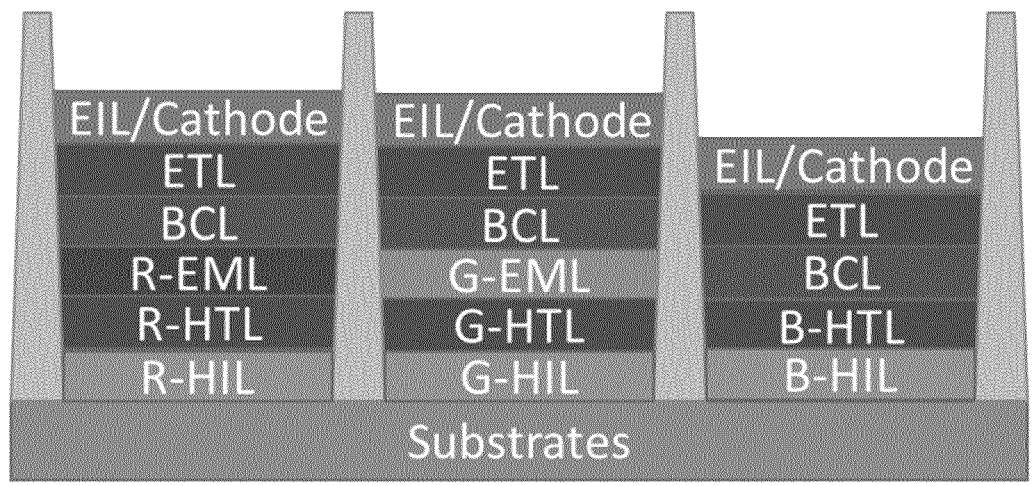
FIG. 1 illustrates a schematic view of a preferred device having a blue common layer (BCL) structure.

The method for forming an organic element of an electronic device having at least two different pixel types including a first pixel type (pixel A) and a second pixel type (pixel B) wherein at least one layer of the pixel A and one layer of pixel B are deposited by applying an ink at the same time. An element is a part of an electronic device having a specific function as mentioned above and below, e.g. being able to emit light and preferably have pixels which can be controlled in order to emit light.

The electronic device has at least two different pixel types including a first pixel type (pixel A) and a second pixel type (pixel B). A pixel type is a part of the electronic device having the same features, e.g. the same colour. Preferably, the at least two pixel types (A) and (B) differ in their colour. In a specific embodiment, the electronic device preferably has three different pixel types. These three pixel types preferably differ in their colour. If the device includes three different pixel types, the relative difference of the drying time as mentioned above for two pixels $(t_1-t_2/t_1)$ is preferably fulfilled for all the inks being applied at the same time.

The expression "applying an ink at the same time" means that the different inks are provided to the substrate or the layer on which the inks are applied within one step. Preferably, the inks are applied parallel, e.g. by using ink jet technique with two or more printing heads. Especially, no drying is performed between two different inks are applied, if the inks are applied at the same time.

The ink for manufacturing a layer for the pixel A and the ink for manufacturing a layer for the pixel B which are deposited at the same time can be same or different. Preferably, the pixels comprise different layers as mentioned above and below. Some of the layers of the different pixel may be obtained by using the same ink, e.g. in order to achieve a hole injection layer (HIL).

The layer obtained by depositing the ink for manufacturing a layer for the pixel A and the layer obtained by depositing the ink for manufacturing a layer for the pixel B are dried after the application of the different inks which are applied at the same time. Here the drying means removing the solvent until its volume is less than 1% of initial ink volume in the pixel. The relative difference of the drying time $(t_1-t_2/t_1)$ of both layers being deposited at the same time and being obtained by two different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$.

Preferably, the relative difference of the drying time $(t_1-t_2/t_1)$ is at most 0.2, more preferably at most 0.1, even more preferably at most 0.05 and most preferably at most 0.02.

In a specific embodiment, the absolute difference of the drying time $(t_1-t_2)$ is preferably at most 120 seconds, more preferably at most 60 seconds, even more preferably at most 30 seconds, most preferably at most 5 seconds and even most preferably at most 1 second wherein $t_1$ is the drying time of the layer of one pixel type and $t_2$ is the drying time of the layer of the other pixel type and $t_1$ is greater than or equal to $t_2$.

Preferably, the following relation is fulfilled:

$$1/3(A_{pixelB}*T_{pixelB}/C_{inkB}) \leq (A_{pixelA}*T_{pixelA}/C_{inkA}) \leq 3(A_{pixelB}*T_{pixelB}/C_{inkB})$$

wherein $A_{pixel\ B}$ is the pixel area of pixel B, $T_{pixelB}$ is the layer thickness in pixel B and $C_{pixelB}$ is the ink concentration for obtaining pixel B, $A_{pixelA}$ is the pixel area of pixel A, $T_{pixelA}$ is the layer thickness in pixel A and $C_{pixelA}$ is the ink concentration for obtaining pixel A each for the layer being dried at the same time.

More preferably, the following relation is fulfilled:

$$2/3(A_{pixelB}*T_{pixelB}/C_{inkB}) \leq (A_{pixelA}*T_{pixelA}/C_{inkA}) \leq 3/2(A_{pixelB}*T_{pixelB}/C_{inkB})$$

wherein the symbols have the meaning as mentioned above.

Preferably, the absolute drying time $t_1$ is at most 300 seconds, more preferably at most 150 seconds, even more preferably at most 100 seconds and most preferably at most 60 seconds.

In a special embodiment, the absolute drying time $t_2$ is preferably at most 300 seconds, more preferably at most 150 seconds, even more preferably at most 100 seconds and most preferably at most 60 seconds.

It should be noted that preferably, a pre-structured substrate is used in order to achieve an electronic device. The pre-structured substrate having a specific pixel structure depending on the needs and demands of the device. Therefore, the different pixels may have a different area and the different layers of each pixel may have different thicknesses. E.g. the thickness of the red pixel HTL may be different to the blue pixel HTL and the area of the blue pixel may be greater than the area of the green pixel.

The ink for manufacturing a layer for the pixel A and the ink for manufacturing a layer for the pixel B which are deposited at the same time can be same or different and the difference in the inks is preferably based on a functional material comprised in the ink. Preferably, the difference in the inks being preferably based on a functional material concerns the type of the functional material, e.g. the colour of the EML is due to the functional material of the ink used to achieve a specific colour.

In a further embodiment of the present invention, the ink for manufacturing a layer for the pixel A and the ink for manufacturing a layer for the pixel B which are deposited at the same time can be same or different and the difference in the inks is preferably based on a concentration of a functional material comprised by the ink.

Furthermore, the ink for manufacturing a layer for the pixel A and the ink for manufacturing a layer for the pixel B preferably comprises an identical solvent. In a preferred embodiment, the ink for manufacturing a layer for the pixel A and the ink for manufacturing a layer for the pixel B comprise preferably at least 50% by weight, more preferably at least 80% by weight of one or more identical solvents.

In a further embodiment of the present invention, the ink for manufacturing a layer for the pixel A and the ink for manufacturing a layer for the pixel B which are deposited at the same time are different and the difference in the inks is preferably based on a solvent comprised in the inks.

Preferably, the ink for manufacturing a layer for the pixel A and the ink for manufacturing a layer for the pixel B which are deposited at the same time are different and the difference in the inks is based on a solvent, wherein the ink for manufacturing a layer of pixel A comprises a solvent A and the ink for manufacturing a layer of pixel B comprises a solvent B. In a specific embodiment, the ink for obtaining a layer of pixel A preferably comprises at least 50% by weight of solvent A. Preferably, the ink for obtaining a layer of pixel B comprises at least 50% by weight of solvent B. The solvent A is different to the solvent B.

In a further preferred embodiment, the difference between the boiling point of solvent A and the boiling point of solvent B is below 80° C., preferably below 60° C. and more preferably below 40° C.

Preferably, the ratio of the printing volume ($V^A$) of the ink for manufacturing a layer for the pixel A to the printing volume ($V^B$) of the ink for manufacturing a layer for the pixel B ($V^A/V^B$) is in the range of 1:10 to 10:1, preferably in the range of 1:5 to 5:1, more preferably in the range of 1:2 to 2:1 and most preferably in the range of 2:3 to 3:2.

The viscosity of the solvent is in a range such that the solvent can be processed by usual printing techniques as mentioned above and below. Therefore, a solvent comprising a viscosity in the range of 0.1 to 2000 mPas at the printing temperatures as mentioned above and below (e.g. 10° C., 15° C., 25° C., 40° C., 60° C. and 80° C., respectively) is considered liquid.

The viscosity values are measured with a parallel plate rotational rheometer (AR-G2 or Discovery HR-3 TA Instruments) at a sheer rate of 500 $s^{-1}$, unless stated otherwise.

The ink deposited for manufacturing a layer comprises a solvent. Solvents are compounds being removed after the ink is applied to form a layer as mentioned above and below.

In a preferred embodiment, the solvent exhibits a viscosity in the range of 0.5 to 50 mPas, more preferably 1 to 20 mPas, even more preferably 2 to 15 mPas and most preferably 3 to 10 mPas at 25.0° C.

The viscosity of the solvents is measured with a parallel plate rotational rheometer of the type Discovery HR3 (TA Instruments). The equipment allows a precise control of the temperature and sheer rate. The measurement of the viscosity is carried out at a temperature of 25.0° C.(+/−0.2° C.) and a sheer rate of 500 $s^{-1}$. Each sample is measured three times and the obtained measured values are averaged. A certified standard viscosity oil is measured prior to measuring the solvents.

Preferred organic solvents can exhibit Hansen Solubility parameters of Hd in the range of 15.5 to 22.0 $MPa^{0.5}$, $H_p$ in the range of 0.0 to 12.5 $MPa^{0.5}$ and $H_h$ in the range of 0.0 to 15.0 $MPa^{0.5}$. More preferred first organic solvents exhibit Hansen Solubility parameters of Hd in the range of 16.5 to 21.0 $MPa^{0.5}$, $H_p$ in the range of 0.0 to 6.0 $MPa^{0.5}$ and $H_h$ in the range of 0.0 to 6.0 $MPa^{0.5}$.

The Hansen Solubility Parameters can be determined according to the Hansen Solubility Parameters in Practice HSPiP 4th edition, (Software version 4.0.7) with reference to the Hansen Solubility Parameters: A User's Handbook, Second Edition, C. M. Hansen (2007), Taylor and Francis Group, LLC) as supplied by Hanson and Abbot et al.

Preferably, the organic solvent has a boiling point of 400° C. or below, preferably in the range from 150° C. to 400° C., more preferably in the range from 200° C. to 350° C. and most preferably in the range from 240° C. to 300° C., wherein the boiling point is given at 760 mm Hg.

Suitable organic solvents are preferably solvents which include inter alia aldehydes, ketones, ethers, esters, amides such as di-$C_{1-2}$-alkylform-amides, sulfur compounds, nitro compounds, hydrocarbons, halogenated hydrocarbons (e.g. chlorinated hydrocarbons), aromatic or heteroaromatic hydrocarbons, halogenated aromatic or heteroaromatic hydrocarbons, preferably ketones, ethers and esters.

Preferably, the organic solvent is selected from the group consisting of substituted and non-substituted aromatic or linear esters such as ethyl benzoate, butyl benzoate; substituted and non-substituted aromatic or linear ethers such as 3-phenoxytoluene or anisole derivatives; substituted or non-substituted arene derivatives such as xylene; indane derivatives such as hexamethylindane; substituted and non-substituted aromatic or linear ketones; substituted and non-substituted heterocycles such as pyrrolidinones, pyridines; fluorinated or chlorinated hydrocarbons; and linear or cyclic siloxanes.

Particularly preferred organic solvents are, for example, 1,2,3,4-tetramethyl-benzene, 1,2,3,5-tetramethylbenzene, 1,2,3-trimethylbenzene, 1,2,4-trichlorobenzene, 1,2,4-trimethylbenzene, 1,2-dihydronaphthalene, 1,2-dimethylnaphthalene, 1,3-benzodioxolane, 1,3-diisopropylbenzene, 1,3-dimethylnaphthalene, 1,4-benzodioxane, 1,4-diisopropylbenzene, 1,4-dimethylnaphthalene, 1,5-dimethyltetralin, 1-benzothiophene, 1-bromonaphthalene, 1-chloromethylnaphthalene, 1-ethylnaphthalene, 1-methoxynaphthalene, 1-methylnaphthalene, 1-methylindole, 2,3-benzofuran, 2,3-dihydrobenzofuran, 2,3-dimethylanisole, 2,4-dimethylanisole, 2,5-dimethylanisole, 2,6-dimethylanisole, 2,6-dimethylnaphthalene, 2-bromo-3-bromomethylnaphthalene, 2-bromomethylnaphthalene, 2-bromonaphthalene, 2-ethoxynaphthalene, 2-ethylnaphthalene, 2-isopropylanisole, 2-methylanisole, 2-methylindole, 3,4-dimethylanisole, 3,5-dimethylanisole, 3-bromoquinoline, 3-methyl-anisole, 4-methylanisole, 5-decanolide, 5-methoxyindane, 5-methoxyindole, 5-tert-butyl-m-xylene, 6-methylquinoline, 8-methylquinoline, acetophenone, anisole, benzonitrile, benzothiazole, benzyl acetate, bromobenzene, butyl benzoate, butyl phenyl ether, cyclohexylbenzene, decahydronaphthol, dimethoxytoluene, 3-phenoxytoluene, diphenyl ether, propiophenone, ethylbenzene, ethyl benzoate, γ-terpinene, hexylbenzene, indane, hexamethylindane, indene, isochroman, cumene, m-cymene, mesitylene, methyl benzoate, o-, m-, p-xylene, propyl benzoate, propylbenzene, o-dichlorobenzene, pentylbenzene, phenetol, ethoxybenzene, phenyl acetate, p-cymene, propiophenone, sec-butylbenzene, t-butylbenzene, thiophene, toluene, veratrol, monochlorobenzene, o-dichlorobenzene, pyridine, pyrazine, pyrimidine, pyrrolidinone, morpholine, dimethylacetamide, dimethyl sulfoxide, decaline and/or mixtures of these compounds.

These organic solvents can be employed individually or as a mixture of two, three or more solvents forming the organic solvent.

Preferably, the ink has a surface tension in the range from 1 to 70 mN/m, preferably in the range from 10 to 60 mN/m, more preferably in the range from 20 to 50 mN/m and most preferably in the range from 30 to 45 mN/m.

The surface tension of the inks of the present invention is measured by pendant drop characterization which is an optical method. This measurement technique dispenses a drop from a needle in a bulk gaseous phase. The shape of the drop results from the relationship between the surface tension, gravity and density differences. Using the pendant drop method, the surface tension is calculated from the shadow image of a pendant drop using drop shape analysis. A commonly used and commercially available high precision drop shape analysis tool, namely the FTA 1000 from First Ten Angstrom, was used to perform all surface tension measurements. The surface tension is determined by the software in accordance with DIN 55660-1 (Version 2011-12). All measurements were performed at room temperature which is in the range between 22° C. and 24° C., preferably 23.4° C. The standard operating procedure includes the determination of the surface tension of each ink using a fresh disposable drop dispensing system (syringe and needle). Each drop is measured and for each ink a minimum of three drops are measured. The final value is averaged over said measurements. The tool is regularly cross-checked against various liquids having well known surface tensions.

Preferably, the ink has a viscosity in the range from 0.5 to 50 mPas, more preferably in the range from 1 to 20 mPas, even more preferably in the range from 2 to 15 mPas and most preferably in the range from 3 to 10 mPas at 25° C.

The viscosity of the inks useful in the present invention is measured with a parallel plate rotational rheometer of the type Discovery HR3 (TA Instruments). The equipment allows a precise control of the temperature and sheer rate. The measurement of the viscosity is carried out at a temperature of 25.0° C.(+/−0.2° C.) and a sheer rate of 500 s$^{-1}$, according to DIN 1342-2 (Version 2003-11). Each sample is measured three times and the obtained measured values are averaged. A certified standard viscosity oil is measured prior to measuring the solvents.

In an embodiment of the present invention, the ink deposited for manufacturing a layer comprises a solvent and an organic functional material wherein the organic functional material has a solubility in the organic solvent of at least 1 g/l at 25° C., preferably at least 5 g/l at 25° C.

Preferably, the ink comprises at least 0.01% by weight, more preferably 0.1% by weight, and most preferably at least 0.2% by weight of said organic functional material.

The content of the organic functional material in the ink is preferably in the range from 0.01 to 25% by weight, more preferably in the range from 0.1 to 20% by weight and most preferably in the range from 0.2 to 10% by weight, based on the total weight of the ink.

The ink useful for the present invention comprises at least one organic functional material which can be employed for the production of functional layers of electronic devices. Organic functional materials are generally the organic materials which are introduced between the anode and the cathode of an electronic device.

The organic functional material is preferably selected from the group consisting of organic conductors, organic semiconductors, organic fluorescent compounds, organic phosphorescent compounds, organic light-absorbent compounds, organic light-sensitive compounds, organic photosensitisation agents and other organic photoactive compounds, selected from organometallic complexes of transition metals, rare earths, lanthanides and actinides.

More preferably, the organic functional material is selected from the group consisting of fluorescent emitters, phosphorescent emitters, host materials, matrix materials, exciton-blocking materials, electron-transport materials, electron-injection materials, hole-conductor materials, hole-injection materials, n-dopants, p-dopants, wide-band-gap materials, electron-blocking materials and hole-blocking materials. Even more preferably, the organic functional material is an organic semiconductor selected from the group consisting of hole-injecting, hole-transporting, emitting, electron-transporting and electron-injecting materials. Most preferably, the organic functional material is an organic semiconductor selected from the group consisting of hole-injecting, hole-transporting, emitting and electron-transporting materials.

In a specific embodiment, two layers of one pixel type are preferably manufactured by depositing two ink and the inks deposited for manufacturing two layers comprise each an organic functional material and the energy level difference of the organic functional material comprised by the first ink and the organic functional material comprised by the second ink is at most 0.5 eV, preferably at most 0.3 eV.

Preferably, two layers of one pixel type are manufactured by depositing two inks and the inks deposited for manufacturing two layers comprise each an organic functional material wherein the first layer is a HIL and the second layer is a HTL and the energy level difference of the hole-injecting material comprised in the first ink and the hole-transporting material comprised in the second ink is at most 0.5 eV, preferably at most 0.3 eV.

Furthermore, two layers of one pixel type are preferably manufactured by depositing two inks and the inks deposited for manufacturing two layers comprise each an organic functional material wherein the second layer is a HTL and the third layer is a EML and the energy level difference of the hole-transporting material comprised in the second ink and the emitting material comprised in the third ink is at most 0.5 eV, preferably at most 0.3 eV.

Preferred embodiments of organic functional materials are disclosed in detail in WO 2011/076314 A1 which is incorporated into the present application by way of reference.

In a preferred embodiment, the organic functional material is selected from the group consisting of fluorescent emitters and phosphorescent emitters.

The organic functional material can be a compound having a low molecular weight, a polymer, an oligomer or a dendrimer, where the organic functional material may also be in the form of a mixture. In a preferred embodiment the inks useful for the invention may comprise two different organic functional materials having a low molecular weight, one compound having a low molecular weight and one polymer or two polymers (blend). In a further preferred embodiment the inks useful for the present invention may comprise up to five different organic functional materials which are selected from compounds having a low molecular weight or from polymers.

Preferably, the organic functional material has a low molecular weight. A low molecular weight is a weight of ≤5,000 g/mol, preferably ≤3,000 g/mol, more preferably ≤2,000 g/mol and most preferably ≤1,800 g/mol.

Organic functional materials are frequently described by the properties of their frontier orbitals, which are described in greater detail below. Molecular orbitals, in particular also the highest occupied molecular orbital (HOMO) and the lowest unoccupied molecular orbital (LUMO), their energy levels and the energy of the lowest triplet state $T_1$ or of the lowest excited singlet state Si of the materials are determined via quantum-chemical calculations. In order to calculate organic substances without metals, firstly a geometry optimisation is carried out using the "Ground State/Semi-empirical/Default Spin/AM1/Charge 0/Spin Singlet" method. An energy calculation is subsequently carried out on the basis of the optimised geometry. The "TD-SCF/DFT/Default Spin/B3PW91" method with the "6-31G(d)" base set (charge 0, spin singlet) is used here. For metal-containing compounds, the geometry is optimised via the "Ground State/Hartree-Fock/Default Spin/LanL2MB/Charge 0/Spin Singlet" method. The energy calculation is carried out analogously to the above-described method for the organic substances, with the difference that the "LanL2DZ" base set is used for the metal atom and the "6-31G(d)" base set is used for the ligands. The energy calculation gives the HOMO energy level HEh or LUMO energy level LEh in hartree units. The HOMO and LUMO energy levels in electron volts calibrated with reference to cyclic voltammetry measurements are determined therefrom as follows:

$$HOMO(eV)=((HEh*27.212)-0.9899)/1.1206$$

$$LUMO(eV)=((LEh*27.212)-2.0041)/1.385$$

For the purposes of this application, these values are to be regarded as HOMO and LUMO energy levels respectively of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

The method described herein is independent of the software package used and always gives the same results. Examples of frequently used programs for this purpose are "Gaussian09W" (Gaussian Inc.) and Q-Chem 4.1 (Q-Chem, Inc.).

Materials having hole-injection properties, also called hole-injection materials herein, simplify or facilitate the transfer of holes, i.e. positive charges, from the anode into an organic layer. In general, a hole-injection material has an HOMO level which is in the region of or above the Fermi level of the anode.

Compounds having hole-transport properties, also called hole-transport materials herein, are capable of transporting holes, i.e. positive charges, which are generally injected from the anode or an adjacent layer, for example a hole-injection layer. A hole-transport material generally has a high HOMO level of preferably at least −5.4 eV. Depending on the structure of the electronic device, it may also be possible to employ a hole-transport material as hole-injection material.

The preferred compounds which have hole-injection and/or hole-transport properties include, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). Polymers such as PEDOT:PSS can also be used as compounds with hole-injection and/or hole-transport properties.

As compounds which have hole-injection and/or hole-transport properties, particular mention may be made of phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydra-zone derivatives (U.S. Pat. No. 3,717,462), acylhydrazones, stilbene derivatives (JP-A-61-210363), silazane derivatives (U.S. Pat. No. 4,950,950), polysilanes (JP-A-2-204996), aniline copolymers (JP-A-2-282263), thiophene oligomers (JP Heisei 1 (1989) 211399), polythiophenes, poly(N-vinylcarbazole) (PVK), polypyrroles, polyanilines and other electrically conducting macromolecules, porphyrin compounds (JP-A-63-2956965, U.S. Pat. No. 4,720,432), aromatic dimethylidene-type compounds, carbazole compounds, such as, for example, CDBP, CBP, mCP, aromatic tertiary amine and styrylamine compounds (U.S. Pat. No. 4,127,412), such as, for example, triphenylamines of the benzidine type, triphenylamines of the styrylamine type and triphenylamines of the diamine type. It is also possible to use arylamine dendrimers (JP Heisei 8 (1996) 193191), monomeric triarylamines (U.S. Pat. No. 3,180,730), triarylamines containing one or more vinyl radicals and/or at least one functional group containing active hydrogen (U.S. Pat. Nos. 3,567,450 and 3,658,520), or tetraaryldiamines (the two tertiary amine units are connected via an aryl group). More triarylamino groups may also be present in the molecule. Phthalocyanine derivatives, naphthalocyanine derivatives, butadiene derivatives and quinoline derivatives, such as, for example, dipyrazino[2,3-f:2',3'-h]quinoxalinehexacarbonitrile, are also suitable.

Preference is given to aromatic tertiary amines containing at least two tertiary amine units (US 2008/0102311 A1, U.S. Pat. Nos. 4,720,432 and 5,061,569), such as, for example, NPD (α-NPD=4,4'-bis[N-(1-naphthyl)-N-phenyl-amino]biphenyl) (U.S. Pat. No. 5,061,569), TPD 232(=N,N'-bis-(N,N'-diphenyl-4-aminophenyl)-N,N-diphenyl-4,4'-diamino-1,1'-biphenyl) or MTDATA (MTDATA or m-MTDATA=4,4',4"-tris[3-methylphenyl)phenylamino]-triphenylamine) (JP-A-4-308688), TBDB(=N,N,N',N'-tetra(4-biphenyl)-diaminobiphenylene), TAPC(=1,1-bis(4-di-p-tolylaminophenyl)cyclohexane), TAPPP(=1,1-bis(4-di-p-tolylaminophenyl)-3-phenylpropane), BDTAPVB(=1,4-bis[2-[4-[N,N-di(p-tolyl)amino]phenyl]vinyl]benzene), TTB (=N,N,N',N'-tetra-p-tolyl-4,4'-diaminobiphenyl), TPD(=4,4'-bis[N-3-methyl-phenyl]-N-phenylamino)biphenyl), N,N,N',N'-tetraphenyl-4,4-diamino-1,1',4',1",4",1"'-quaterphenyl, likewise tertiary amines containing carbazole units, such as, for example, TCTA(=4-(9H-carbazol-9-yl)-N,N-bis[4-(9H-carbazol-9-yl)phenyl]benzenamine). Preference is likewise given to hexa-azatriphenylene compounds in accordance with US 2007/0092755 A1 and phthalocyanine derivatives (for example H₂Pc, CuPc(=copper phthalocyanine), CoPc, NiPc, ZnPc, PdPc, FePc, MnPc, ClAlPc, ClGaPc, ClIinPc, ClSnPc, Cl₂SiPc, (HO)AlPc, (HO)GaPc, VOPc, TiOPc, MoOPc, GaPc-O—GaPc).

Particular preference is given to the following triarylamine compounds of the formulae (TA-1) to (TA-12), which are disclosed in the documents EP 1162193 B1, EP 650 955 B1, Synth.Metals 1997, 91(1-3), 209, DE 19646119 A1, WO 2006/122630 A1, EP 1 860 097 A1, EP 1834945 A1, JP 08053397 A, U.S. Pat. No. 6,251,531 B1, US 2005/0221124, JP 08292586 A, U.S. Pat. No. 7,399,537 B2, US 2006/0061265 A1, EP 1 661 888 and WO 2009/041635. The said compounds of the formulae (TA-1) to (TA-12) may also be substituted:

formula TA-1

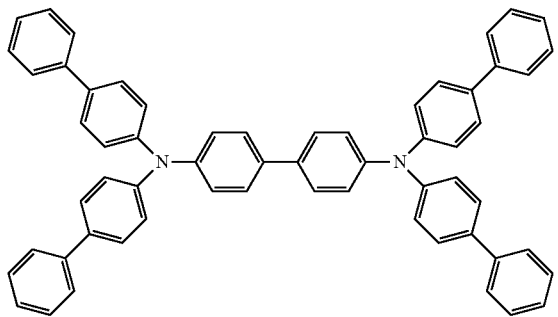

formula TA-2

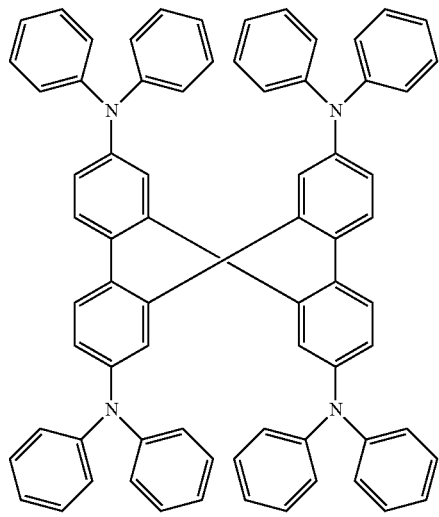

formula TA-3

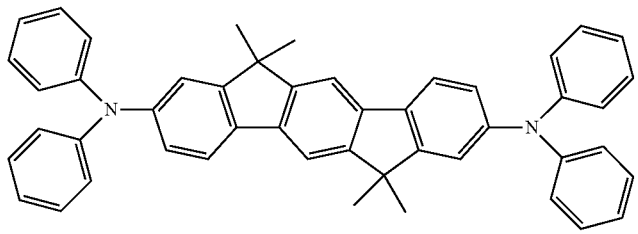

formula TA-4

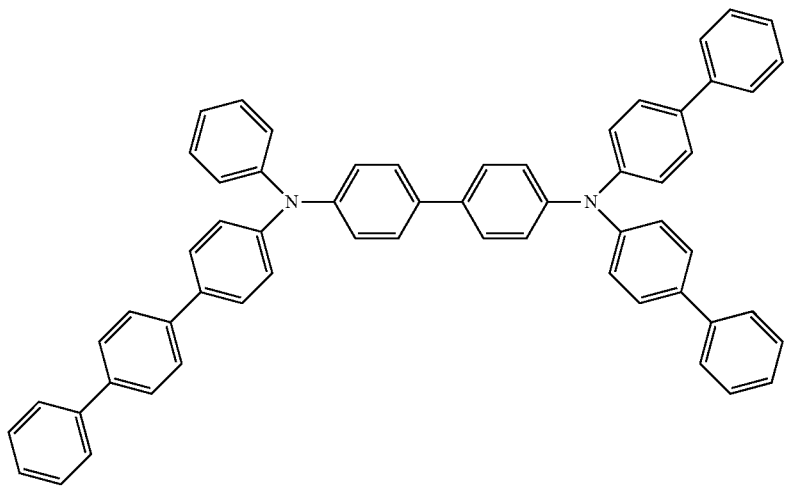

-continued
formula TA-5
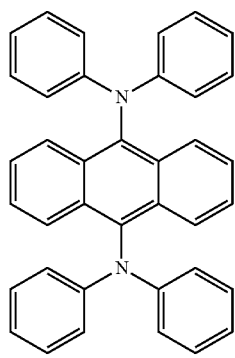
formula TA-6
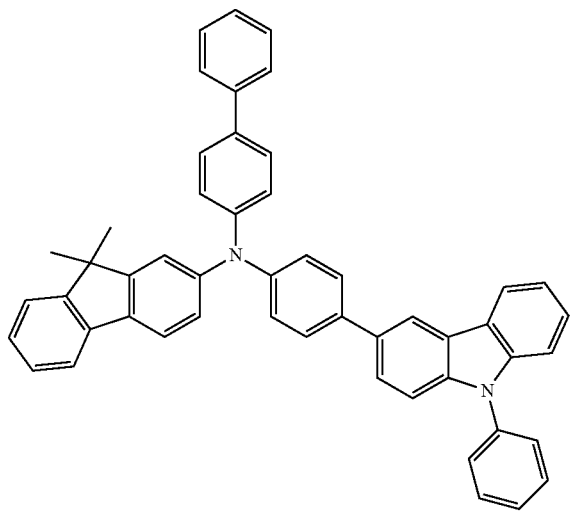
formula TA-7
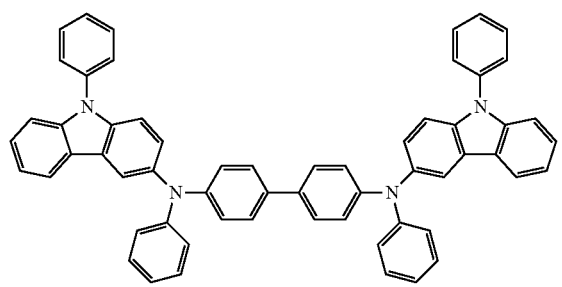
formulat TA-8
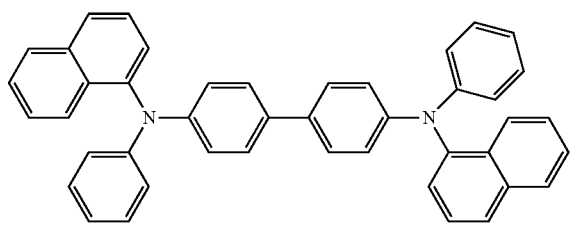
NPB = alpha-NPD
formula TA-9
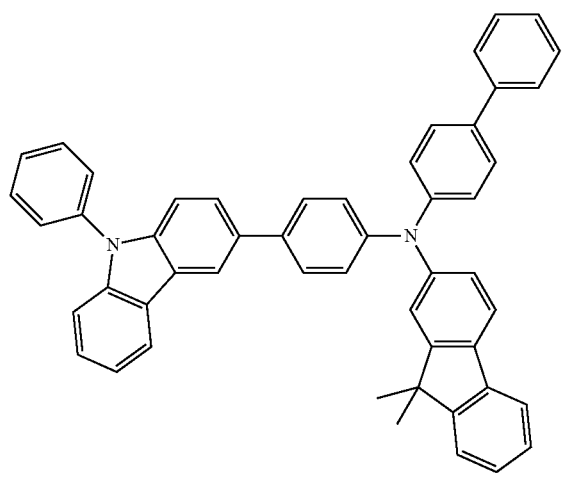
formula TA-10
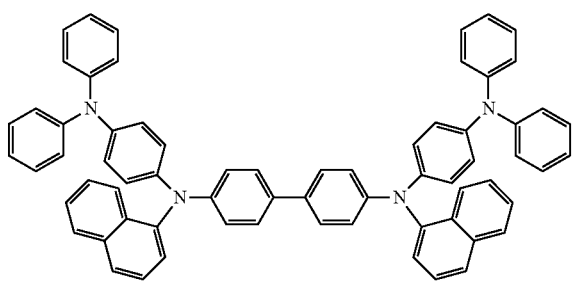

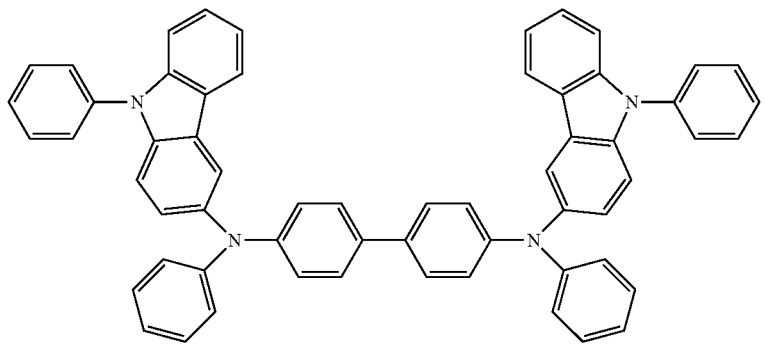

formula TA-11

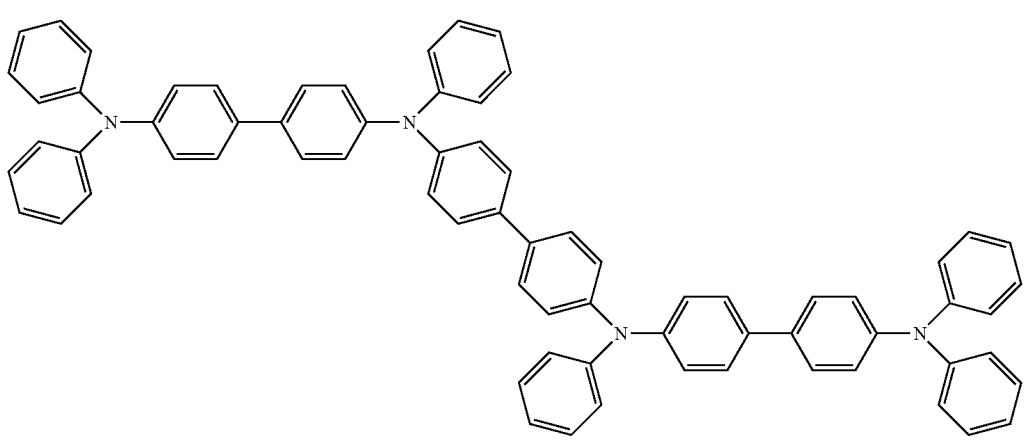

formula TA-12

Further compounds which can be employed as hole-injection materials are described in EP 0891121 A1 and EP 1029909 A1, injection layers in general in US 2004/0174116 A1.

These arylamines and heterocycles which are generally employed as hole-injection and/or hole-transport materials preferably result in an HOMO in the polymer of greater than −5.8 eV (vs. vacuum level), particularly preferably greater than −5.5 eV.

Compounds which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital).

Particularly suitable compounds for electron-transporting and electron-injecting layers are metal chelates of 8-hydroxyquinoline (for example LiQ, AlQ$_3$, GaQ$_3$, MgQ$_2$, ZnQ$_2$, InQ$_3$, ZrQ$_4$), BAIQ, Ga oxinoid complexes, 4-azaphenanthren-5-ol-Be complexes (U.S. Pat. No. 5,529,853 A, cf. formula ET-1), butadiene derivatives (U.S. Pat. No. 4,356,429), heterocyclic optical brighteners (U.S. Pat. No. 4,539,507), benzimidazole derivatives (US 2007/0273272 A1), such as, for example, TPBI (U.S. Pat. No. 5,766,779, cf. formula ET-2), 1,3,5-triazines, for example spirobifluo-renyltriazine derivatives (for example in accordance with DE 102008064200), pyrenes, anthracenes, tetracenes, fluorenes, spiro-fluorenes, dendrimers, tetracenes (for example rubrene derivatives), 1,10-phenanthroline derivatives (JP 2003-115387, JP 2004-311184, JP-2001-267080, WO 02/043449), silacyclopentadiene derivatives (EP 1480280, EP 1478032, EP 1469533), borane derivatives, such as, for example, triarylborane derivatives containing Si (US 2007/0087219 A1, cf. formula ET-3), pyridine derivatives (JP 2004-200162), phenanthrolines, especially 1,10-phenanthroline derivatives, such as, for example, BCP and Bphen, also several phenanthrolines connected via biphenyl or other aromatic groups (US-2007-0252517 A1) or phenanthrolines connected to anthracene (US 2007-0122656 A1, cf. formulae ET-4 and ET-5).

formula ET-1

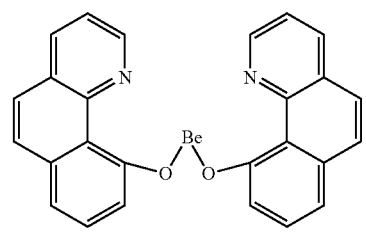

formula ET-2

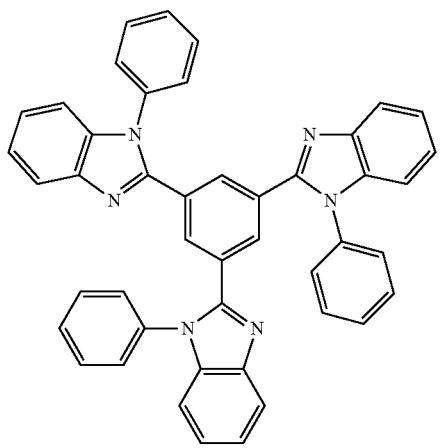

TPBI
2,2′,2″-(1,3,5-benzenetriyl)tris(1-phenyl-1H-benzimidazole)

formula ET-3

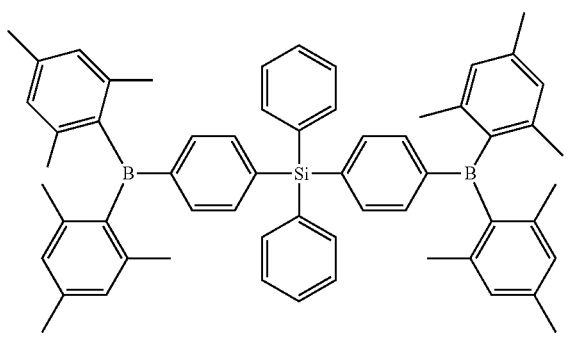

formula ET-4 formula ET-5

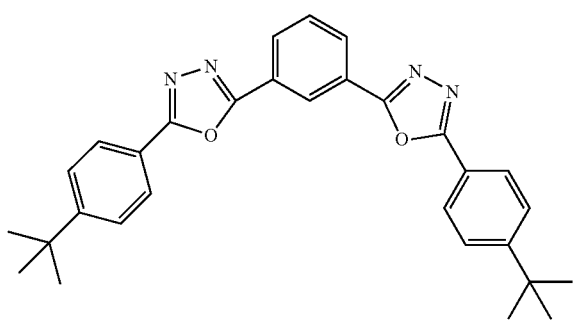

Likewise suitable are heterocyclic organic compounds, such as, for example, thiopyran dioxides, oxazoles, triazoles, imidazoles or oxadiazoles. Examples of the use of five-membered rings containing N, such as, for example, oxazoles, preferably 1,3,4-oxadiazoles, for example compounds of the formulae ET-6, ET-7, ET-8 and ET-9, which are disclose, inter alia, in US 2007/0273272 A1; thiazoles, oxadiazoles, thiadiazoles, triazoles, inter alia, see US 2008/0102311 A1 and Y. A. Levin, M. S. Skorobogatova, Khimiya Geterotsiklicheskikh Soedinenii 1967 (2), 339-341, preferably compounds of the formula ET-10, silacyclopentadiene derivatives. Preferred compounds are the following of the formulae (ET-6) to (ET-10):

formula ET-6

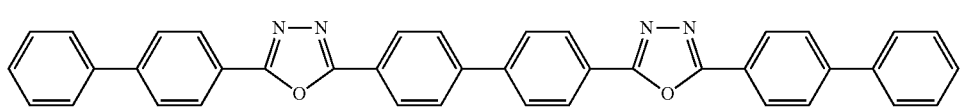

formula ET-7

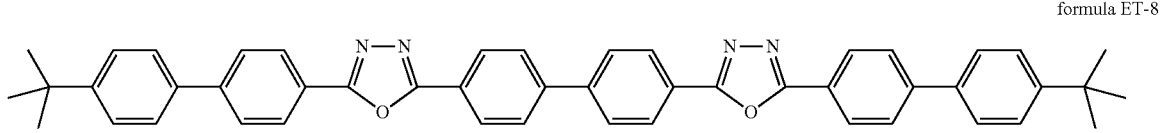

formula ET-8 formula ET-9

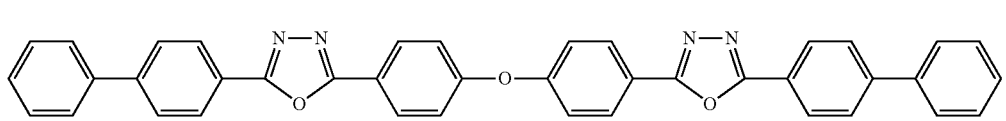

-continued

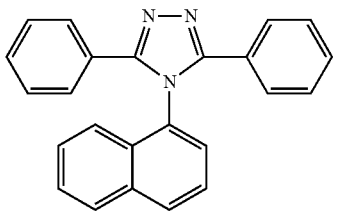

formula ET-10

It is also possible to employ organic compounds, such as derivatives of fluorenone, fluorenylidenemethane, perylenetetracarbonic acid, anthraquinonedimethane, diphenoquinone, anthrone and anthraquinonediethylenediamine.

Preference is given to 2,9,10-substituted anthracenes (with 1- or 2-naphthyl and 4- or 3-biphenyl) or molecules which contain two anthracene units (US2008/0193796 A1, cf. formula ET-11). Also very advantageous is the connection of 9,10-substituted anthracene units to benzimidazole derivatives (US 2006 147747 A and EP 1551206 A1, cf. formulae ET-12 and ET-13).

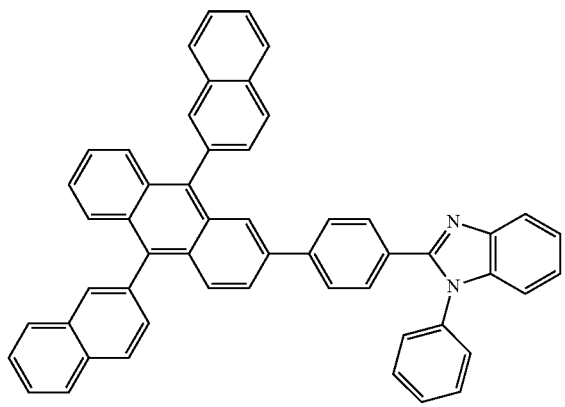

formula ET-11

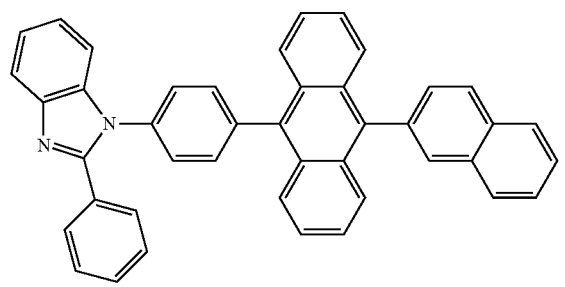

formula ET-12

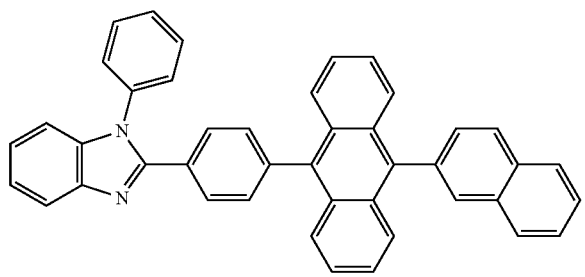

formula ET-13

The compounds which are able to generate electron-injection and/or electron-transport properties preferably result in an LUMO of less than −2.5 eV (vs. vacuum level), particularly preferably less than −2.7 eV.

n-Dopants herein are taken to mean reducing agents, i.e. electron donors. Preferred examples of n-dopants are W(hpp)$_4$ and other electron-rich metal complexes in accordance with WO 2005/086251 A2, P=N compounds (for example WO 2012/175535 A1, WO 2012/175219 A1), naphthylenecarbodiimides (for example WO 2012/168358 A1), fluorenes (for example WO 2012/031735 A1), free radicals and diradicals (for example EP 1837926 A1, WO 2007/107306 A1), pyridines (for example EP 2452946 A1, EP 2463927 A1), N-heterocyclic compounds (for example WO 2009/000237 A1) and acridines as well as phenazines (for example US 2007/145355 A1).

The present inks may comprise emitters. The term emitter denotes a material which, after excitation, which can take place by transfer of any type of energy, allows a radiative transition into a ground state with emission of light. In general, two classes of emitter are known, namely fluorescent and phosphorescent emitters. The term fluorescent emitter denotes materials or compounds in which a radiative transition from an excited singlet state into the ground state takes place. The term phosphorescent emitter preferably denotes luminescent materials or compounds which contain transition metals.

Emitters are frequently also called dopants if the dopants cause the properties described above in a system. A dopant in a system comprising a matrix material and a dopant is taken to mean the component whose proportion in the mixture is the smaller. Correspondingly, a matrix material in a system comprising a matrix material and a dopant is taken to mean the component whose proportion in the mixture is the greater. Accordingly, the term phosphorescent emitter can also be taken to mean, for example, phosphorescent dopants.

Compounds which are able to emit light include, inter alia, fluorescent emitters and phosphorescent emitters. These include, inter alia, compounds containing stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene and/or pyrene structures. Particular preference is given to compounds which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding compounds which contain elements from group 8 to 10 (Ru, Os, Rh, Ir, Pd, Pt). Suitable functional compounds here are, for example, various complexes, as described, for example, in WO 02/068435 A1, WO 02/081488 A1, EP 1239526 A2 and WO 2004/026886 A2.

Preferred compounds which can serve as fluorescent emitters are described by way of example below. Preferred fluorescent emitters are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or an aromatic amine in the sense of the present invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Further preferred fluorescent emitters are selected from indenofluorenamines or indenofluorenediamines, which are described, inter alia, in WO 2006/122630; benzoindenofluorenamines or benzoindenofluorenediamines, which are described, inter alia, in WO 2008/006449; and dibenzoindenofluorenamines or dibenzoindenofluorenediamines, which are described, inter alia, in WO 2007/140847.

Examples of compounds from the class of the styrylamines which can be employed as fluorescent emitters are substituted or unsubstituted tristilbenamines or the dopants described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines can be found in US 2007/0122656 A1.

Particularly preferred styrylamine compounds are the compounds of the formula EM-1 described in U.S. Pat. No. 7,250,532 B2 and the compounds of the formula EM-2 described in DE 10 2005 058557 A1:

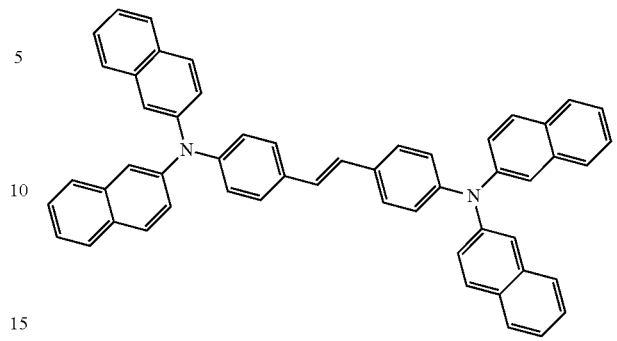

formula EM-1

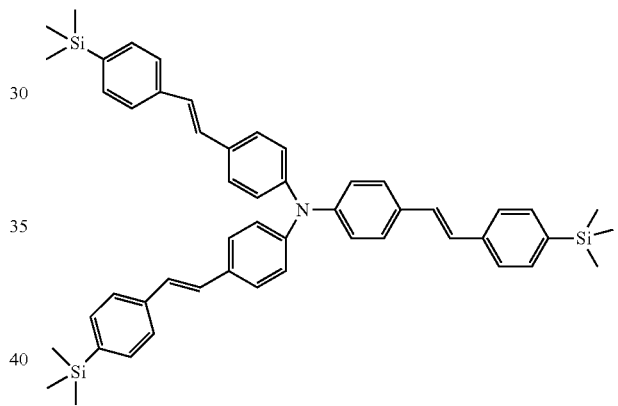

formula EM-2

Particularly preferred triarylamine compounds are compounds of the formulae EM-3 to EM-15 disclosed in CN 1583691 A, JP 08/053397 A and U.S. Pat. No. 6,251,531 B1, EP 1957606 A1, US 2008/0113101 A1, US 2006/210830 A, WO 2008/006449 and DE 102008035413 and derivatives thereof:

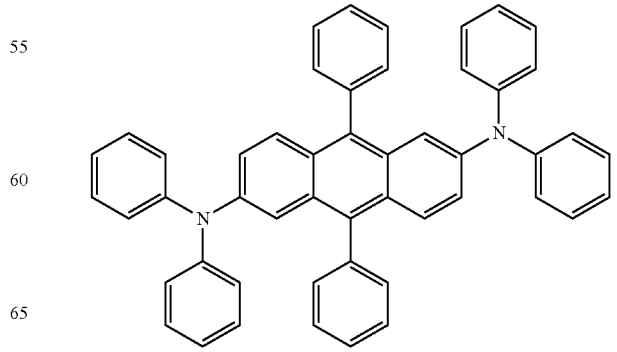

formula EM-3 formula EM-4
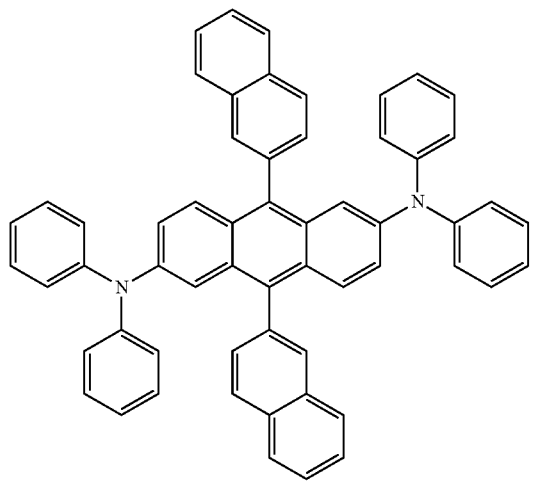
formula EM-5
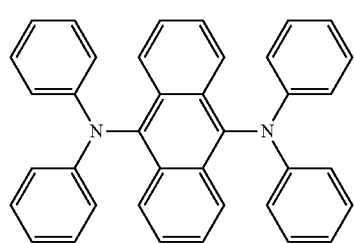
formula EM-6
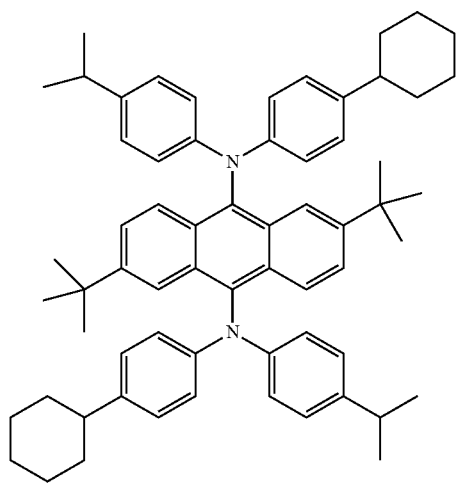
formula EM-7
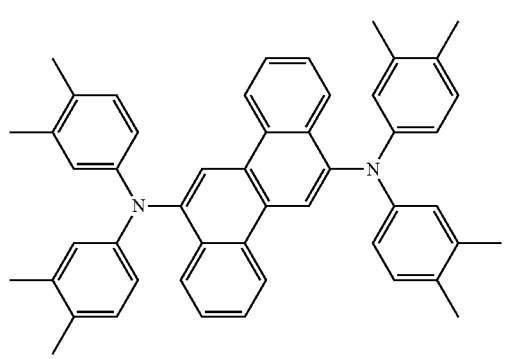
formula EM-8
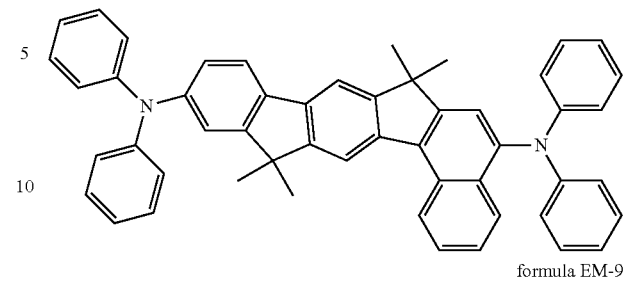
formula EM-9
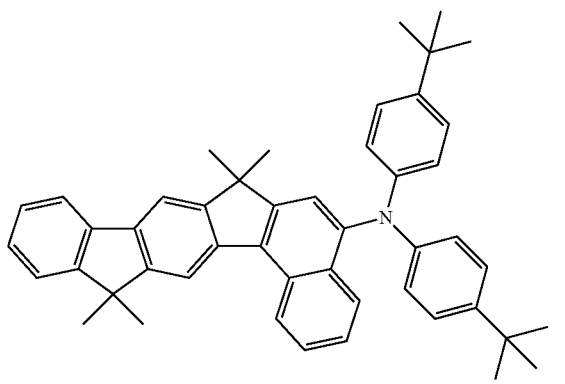
formula EM-10
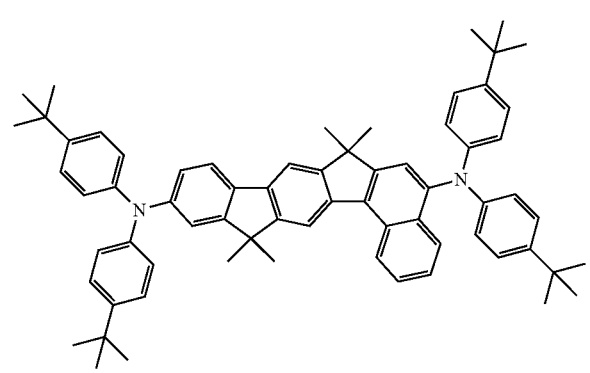
formula EM-11
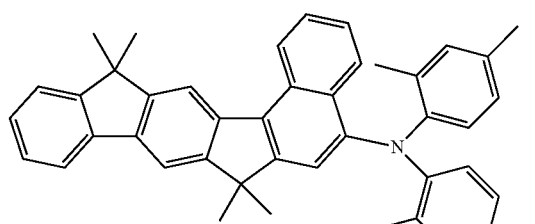
formula EM-12 formula EM-13

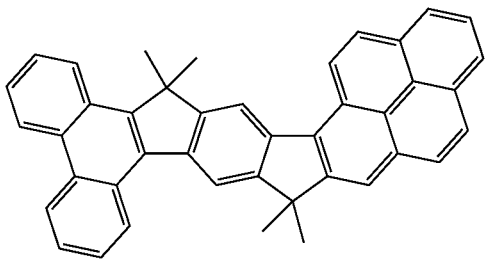

formula EM-14

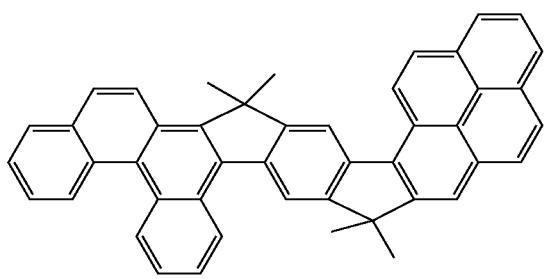

formula EM-15

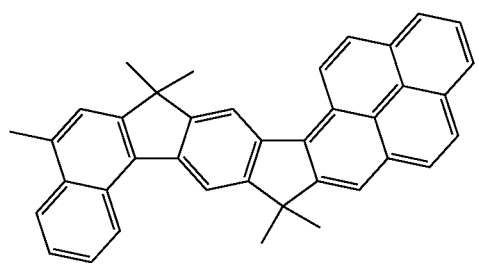

Further preferred compounds which can be employed as fluorescent emitters are selected from derivatives of naphthalene, anthracene, tetracene, benzanthracene, benzophenanthrene (DE 10 2009 005746), fluorene, fluoranthene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. Nos. 4,769,292, 6,020,078, US 2007/0252517 A1), pyran, oxazole, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)-benzene is also a preferred dopant.

Preference is likewise given to derivatives of rubrene, coumarine, rhodamine, quinacridone, such as, for example, DMQA(=N,N'-dimethylquinacridone), dicyanomethylenepyran, such as, for example, DCM(=4-(dicyanoethylene)-6-(4-dimethylaminostyryl-2-methyl)-4H-pyran), thiopyran, polymethine, pyrylium and thiapyrylium salts, periflanthene and indenoperylene.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-bis(9-ethyl-3-carbazovinylene)-1,1'-biphenyl, fluorene, fluoranthene, arylpyrenes (US 2006/0222886 A1), arylenevinylenes (U.S. Pat. Nos. 5,121,029, 5,130,603), bis-(azinyl)imine-boron compounds (US 2007/0092753 A1), bis (azinyl)methene compounds and carbostyryl compounds.

Further preferred blue fluorescent emitters are described in C. H. Chen et al.: "Recent developments in organic electroluminescent materials" Macromol. Symp. 125, (1997) 1-48 and "Recent progress of molecular organic electroluminescent materials and devices" Mat. Sci. and Eng. R, 39 (2002), 143-222.

Further preferred blue-fluorescent emitters are the hydrocarbons disclosed in DE 102008035413.

Preferred compounds which can serve as phosphorescent emitters are described below by way of example.

Examples of phosphorescent emitters are revealed by WO 00/70655, WO 01/41512, WO 02/02714, WO 02/15645, EP 1191613, EP 1191612, EP 1191614 and WO 2005/033244. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Phosphorescent metal complexes preferably contain Ir, Ru, Pd, Pt, Os or Re.

Preferred ligands are 2-phenylpyridine derivatives, 7,8-benzoquinoline derivatives, 2-(2-thienyl)pyridine derivatives, 2-(1-naphthyl)pyridine derivatives, 1-phenylisoquinoline derivatives, 3-phenylisoquinoline derivatives or 2-phenylquinoline derivatives. All these compounds may be substituted, for example by fluoro, cyano and/or trifluoromethyl substituents for blue. Auxiliary ligands are preferably acetylacetonate or picolinic acid.

Preferably, at least one of the organic semiconducting compounds is an organic phosphorescent compound which emits light and in addition contains at least one atom having an atomic number greater than 38.

Preferably, the phosphorescent compounds are compounds of formulae (EM-16) to (EM-19):

formula (EM-16)

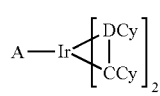

formula (EM-17)

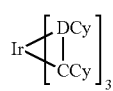

formula (EM-18)

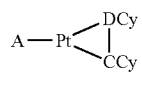

formula (EM-19)

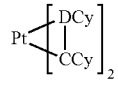

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^a$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^a$;

A is, identically or differently on each occurrence, a monoanionic, bidentate chelating ligand, preferably a diketonate ligand;

$R^a$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^b$—, —$CONR^b$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more $R^c$ radicals, and a plurality of substituents $R^a$, either on the same ring or on two different rings, may together in turn form a mono- or polycyclic, aliphatic or aromatic ring system;

$R^b$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more $R^c$ radicals; and $R^c$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F.

The groups as mentioned above are well known in the art. Additional information are provided by the explizit examples as mentioned above and below. Furthermore, spezific examples of the groups CCy, DCy, A, Ra, Rb and $R^c$ are provided, e.g. in the document WO2015018480A1 which is expressly incorporated herein by reference for its disclosure regarding phosphorescent compounds.

In particular, complexes of Pt or Pd with tetradentate ligands of the formula EM-20 are suitable

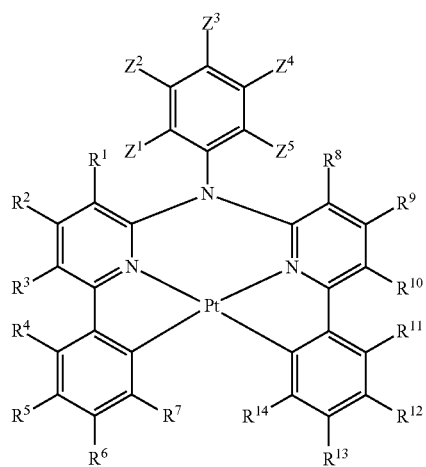

formula EM-20

The compounds of the formula EM-20 are described in greater detail in US 2007/0087219 A1, where, for an explanation of the substituents and indices in the above formula, reference is made to this specification for disclosure purposes.Furthermore, Pt-porphyrin complexes having an enlarged ring system (US 2009/0061681 A1) and Ir complexes, for example 2,3,7,8,12,13,17,18-octaethyl-21H,23H-porphyrin-Pt(II), tetraphenyl-Pt(II) tetrabenzoporphyrin (US 2009/0061681 A1), cis-bis(2-phenylpyridinato-N,$C^{2'}$)Pt(II), cis-bis(2-(2'-thienyl)pyridinato-N,$C^{3'}$)Pt(II), cis-bis(2-(2'-thienyl)-quinolinato-N,$C^{5'}$)Pt(II), (2-(4,6-difluorophenyl)pyridinato-N,$C^{2'}$)Pt(II) (acetylacetonate), or tris(2-phenylpyridinato-N,$C^{2'}$)Ir(III)(=Ir(ppy)$_3$, green), bis (2-phenylpyridinato-N,$C^2$)Ir(III) (acetylacetonate)(=Ir (ppy)$_2$ acetylacetonate, green, US 2001/0053462 A1, Baldo, Thompson et al. Nature 403, (2000), 750-753), bis(1-phenylisoquinolinato-N,$C^{2'}$)(2-phenylpyridinato-N,$C^{2'}$)-iridium(III), bis(2-phenylpyridinato-N,$C^{2'}$)(1-phenylisoquinolinato-N,$C^{2'}$)-iridium(III), bis(2-(2'-benzothienyl)pyridinato-N,$C^{3'}$)iridium(III) (acetylacetonate), bis(2-(4',6'-difluorophenyl)pyridinato-N,$C^{2'}$)iridium(III) (piccolinate) (Flrpic, blue), bis(2-(4',6'-difluorophenyl)pyridinato-N,$C^{2'}$)Ir(III) (tetrakis(1-pyrazolyl)borate), tris(2-(biphenyl-3-yl)-4-tert-butylpyridine)-iridium(III), (ppz)$_2$Ir(5phdpym) (US 2009/0061681 A1), (45ooppz)$_2$-Ir(5phdpym) (US 2009/0061681 A1), derivatives of 2-phenylpyridine-Ir complexes, such as, for example, PQIr(=iridium(III) bis(2-phenylquinolyl-N,$C^{2'}$)acetylacetonate), tris(2-phenylisoquinolinato-N,C)Ir(III) (red), bis(2-(2'-benzo[4,5-a]thienyl)pyridinato-N,$C^3$)Ir (acetylacetonate) ([Btp2Ir(acac)], red, Adachi et al. Appl. Phys. Lett. 78 (2001), 1622-1624).

Likewise suitable are complexes of trivalent lanthanides, such as, for example, $Tb^{3+}$ and $Eu^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl-diimine complexes (Wrighton, JACS 96, 1974, 998, inter alia), Os(II) complexes with cyano ligands and bipyridyl or phenanthroline ligands (Ma et al., Synth. Metals 94, 1998, 245).

Further phosphorescent emitters having tridentate ligands are described in U.S. Pat. No. 6,824,895 and U.S. Ser. No. 10/729,238. Red-emitting phosphorescent complexes are found in U.S. Pat. Nos. 6,835,469 and 6,83,0828.

Particularly preferred compounds which are used as phosphorescent dopants are, inter alia, the compounds of the formula EM-21 described, inter alia, in US 2001/0053462 A1 and Inorg. Chem. 2001, 40(7), 1704-1711, JAGS 2001, 123(18), 4304-4312, and derivatives thereof.

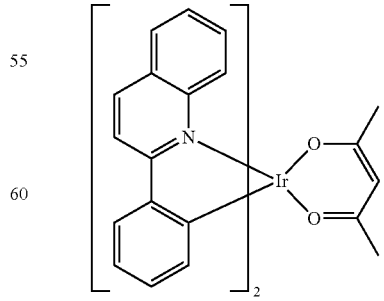

formula EM-21

Derivatives are described in U.S. Pat. Nos. 7,378,162 B2, 6,835,469 B2 and JP 2003/253145 A.

Furthermore, the compounds of the formulae EM-22 to EM-25 described in U.S. Pat. No. 7238437 B2, US 2009/008607 A1 and EP 1348711, and derivatives thereof, can be employed as emitters.

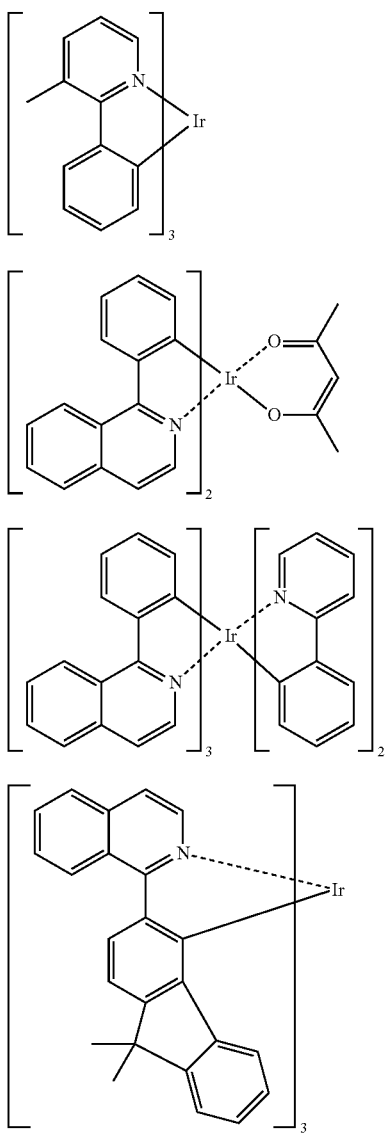

formula EM-22 formula EM-23 formula EM-24 formula EM-25

Quantum dots can likewise be employed as emitters, these materials being disclosed in detail in WO 2011/076314 A1.

Compounds which are employed as host materials, in particular together with emitting compounds, include materials from various classes of substance.

Host materials generally have larger band gaps between HOMO and LUMO than the emitter materials employed. In addition, preferred host materials exhibit properties of either a hole- or electron-transport material. Furthermore, host materials can have both electron- and hole-transport properties.

Host materials are in some cases also called matrix material, in particular if the host material is employed in combination with a phosphorescent emitter in an OLED.

Preferred host materials or co-host materials, which are employed, in particular, together with fluorescent dopants, are selected from the classes of the oligoarylenes (for example 2,2',7,7-tetraphenylspirobifluorene in accordance with EP 676461 or dinaphthylanthracene), in particular the oligoarylenes containing condensed aromatic groups, such as, for example, anthracene, benzanthracene, benzophenanthrene (DE 10 2009 005746, WO 2009/069566), phenanthrene, tetracene, coronene, chrysene, fluorene, spirofluorene, perylene, phthaloperylene, naphthaloperylene, decacyclene, rubrene, the oligoarylenevinylenes (for example DPVBi=4,4'-bis(2,2-diphenylethenyl)-1,1'-biphenyl or spiro-DPVBi in accordance with EP 676461), the polypodal metal complexes (for example in accordance with WO 04/081017), in particular metal complexes of 8-hydroxyquinoline, for example AlQ$_3$(=aluminium(III) tris(8-hydroxyquinoline)) or bis(2-methyl-8-quinolinolato)-4-(phenylphenolinolato)aluminium, also with imidazole chelate (US 2007/0092753 A1) and the quinoline-metal complexes, aminoquinoline-metal complexes, benzoquinoline-metal complexes, the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239).

Particularly preferred compounds which can serve as host materials or co-host materials are selected from the classes of the oligoarylenes, comprising anthracene, benzanthracene and/or pyrene, or atropisomers of these compounds. An oligoarylene in the sense of the present invention is intended to be taken to mean a compound in which at least three aryl or arylene groups are bonded to one another.

Preferred host materials are selected, in particular, from compounds of the formula (H-1),

where Ar$^4$, Ar$^5$, Ar$^6$ are on each occurrence, identically or differently, an aryl or heteroaryl group having 5 to 30 aromatic ring atoms, which may optionally be substituted, and p represents an integer in the range from 1 to 5; the sum of the π electrons in Ar$^4$, Ar$^5$ and Ar$^6$ is at least 30 if p=1 and at least 36 if p=2 and at least 42 if p=3.

In the compounds of the formula (H-1), the group Ar$^5$ particularly preferably stands for anthracene, and the groups Ar$^4$ and Ar$^6$ are bonded in the 9- and 10-position, where these groups may optionally be substituted. Very particularly preferably, at least one of the groups Ar$^4$ and/or Ar$^6$ is a condensed aryl group selected from 1- or 2-naphthyl, 2-, 3- or 9-phenanthrenyl or 2-, 3-, 4-, 5-, 6- or 7-benzanthracenyl. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds containing two anthracene units (US 2008/0193796 A1), for example 10,10'-bis[1,1',4',1"]terphenyl-2-yl-9,9'-bisanthracenyl.

Further preferred compounds are derivatives of arylamine, styrylamine, fluorescein, diphenylbutadiene, tetraphenylbutadiene, cyclopentadiene, tetraphenylcyclopentadiene, pentaphenylcyclopentadiene, coumarine, oxadiazole, bisbenzoxazoline, oxazole, pyridine, pyrazine, imine, benzothiazole, benzoxazole, benzimidazole (US 2007/0092753

A1), for example 2,2',2"-(1,3,5-phenylene)tris[1-phenyl-1H-benzimidazole], aldazine, stilbene, styrylarylene derivatives, for example 9,10-bis[4-(2,2-diphenylethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, cinnamic acid esters and fluorescent dyes.

Particular preference is given to derivatives of arylamine and styrylamine, for example TNB(=4,4'-bis[N-(1-naphthyl)-N-(2-naphthyl)amino]biphenyl). Metal-oxinoid complexes, such as LiQ or AlQ₃, can be used as co-hosts.

Preferred compounds with oligoarylene as matrix are disclosed in US 2003/0027016 A1, U.S. Pat. No. 7,326,371 B2, US 2006/043858 A, WO 2007/114358, WO 2008/145239, JP 3148176 B2, EP 1009044, US 2004/018383, WO 2005/061656 A1, EP 068101961, WO 2004/013073A1, U.S. Pat. No. 5077142, WO 2007/065678 and DE 102009005746, where particularly preferred compounds are described by the formulae H-2 to H-8.

formula H-2 formula H-3 formula H-4 formula H-5

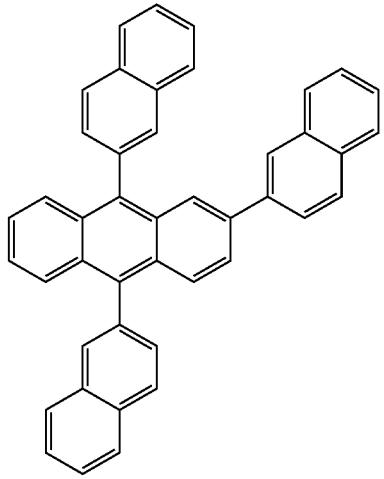

formula H-6

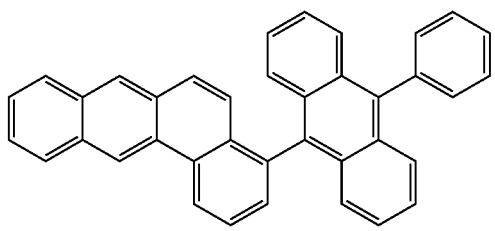

formula H-7

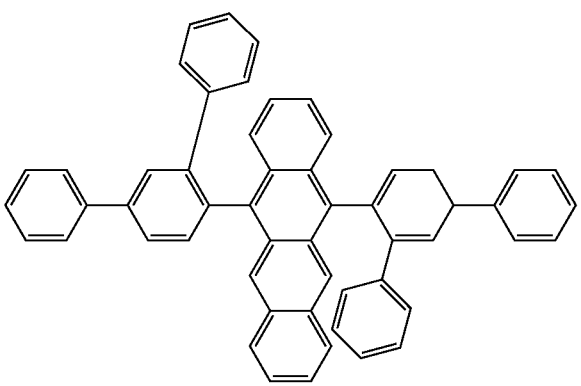

formula H-8

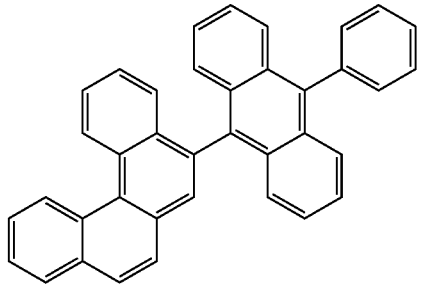

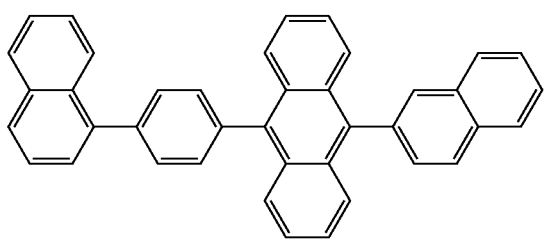

Furthermore, compounds which can be employed as host or matrix include materials which are employed together with phosphorescent emitters.

These compounds, which can also be employed as structural elements in polymers, include CBP (N,N-biscarbazolylbiphenyl), carbazole derivatives (for example in accordance with WO 2005/039246, US 2005/0069729, JP 2004/288381, EP 1205527 or WO 2008/086851), azacarbazoles (for example in accordance with EP 1617710, EP 1617711, EP 1731584 or JP 2005/347160), ketones (for example in accordance with WO 2004/093207 or in accordance with DE 102008033943), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (for example in accordance with DE 102008017591), azaboroles or boronic esters (for example in accordance with WO 2006/117052), triazine derivatives (for example in accordance with DE 102008036982), indolocarbazole derivatives (for example in accordance with WO 2007/063754 or WO 2008/056746), indenocarbazole derivatives (for example in accordance with DE 102009023155 and DE 102009031021), diazaphosphole derivatives (for example in accordance with DE 102009022858), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, $AlQ_3$, which may also contain triarylaminophenol ligands (US 2007/0134514 A1), metal complex/polysilane compounds, and thiophene, benzothiophene and dibenzothiophene derivatives.

Examples of preferred carbazole derivatives are mCP(=1,3-N,N-dicarbazolylbenzene(=9,9'-(1,3-phenylene)bis-9H-carbazole)) (formula H-9), CDBP(=9,9'-(2,2'-dimethyl[1,1'-biphenyl]-4,4'-diyl)bis-9H-carbazole), 1,3-bis(N,N'-dicarbazolyl)benzene(=1,3-bis(carbazol-9-yl)benzene), PVK (polyvinylcarbazole), 3,5-di(9H-carbazol-9-yl)biphenyl and CMTTP (formula H-10). Particularly referred compounds are disclosed in US 2007/0128467 A1 and US 2005/0249976 A1 (formulae H-11 and H-13).

formula H-9

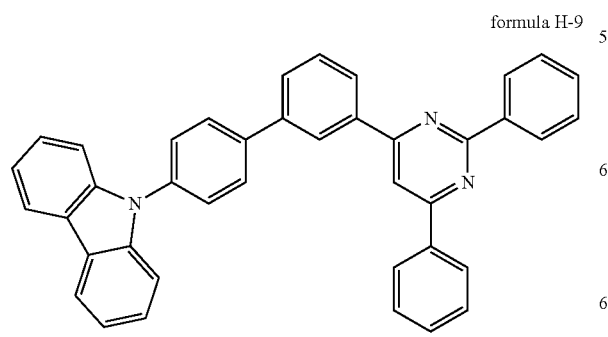

formula H-10

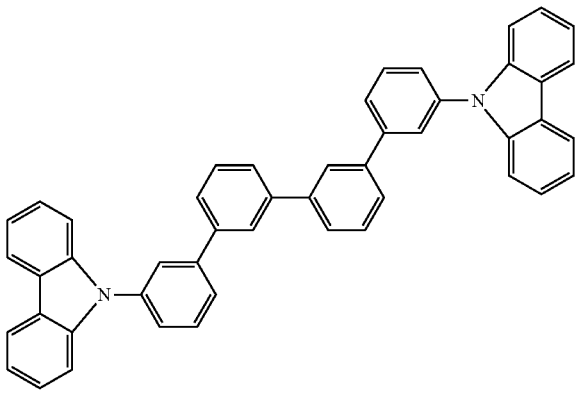

CMTTP formula H-11

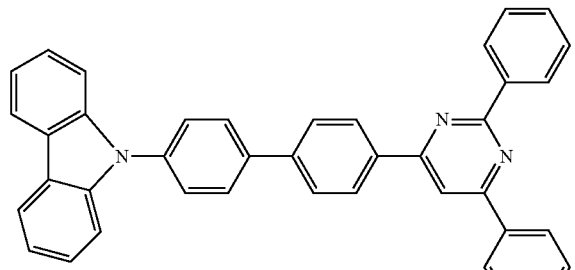

formula H-12

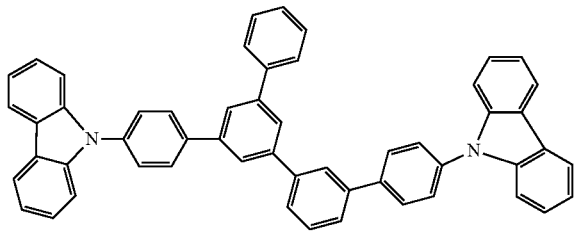

formula H-13

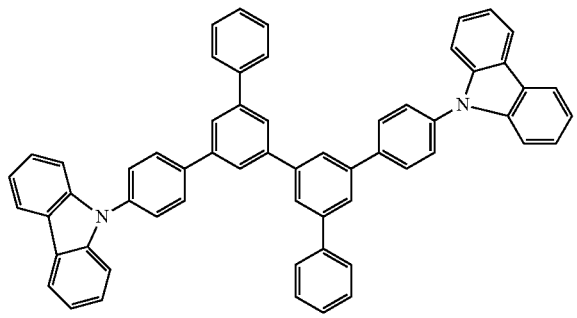

Preferred tetraaryl-Si compounds are disclosed, for example, in US 2004/0209115, US 2004/0209116, US 2007/0087219 A1 and in H. Gilman, E. A. Zuech, Chemistry & Industry (London, United Kingdom), 1960, 120.

Particularly preferred tetraaryl-Si compounds are described by the formulae H-14 to H-20.

formula H-14

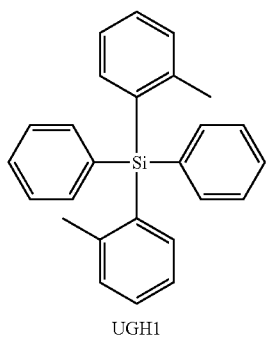

UGH1 formula H-15

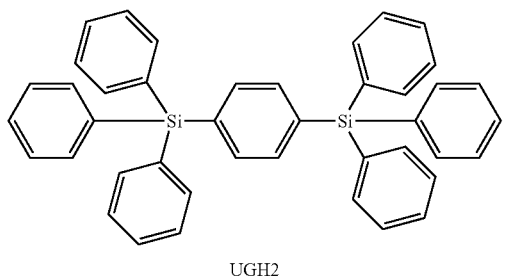

UGH2 formula H-16

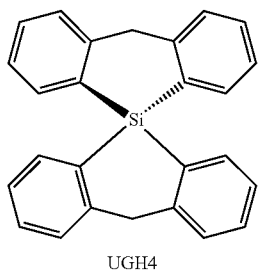

UGH4 formula H-17

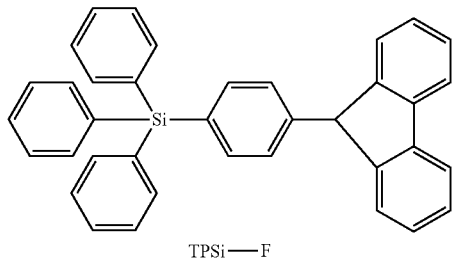

TPSi—F
Triphenyl-[4-(9-phenyl-9H-fluoren-9-yl)phenyl]silane formula H-18

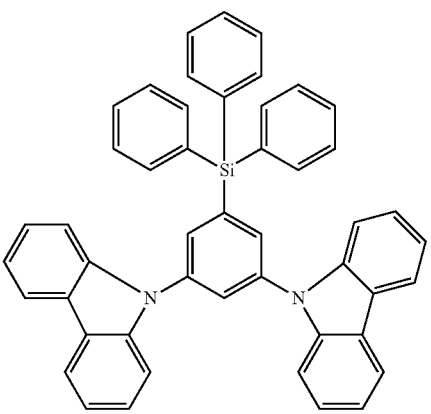

SimCP formula H-19

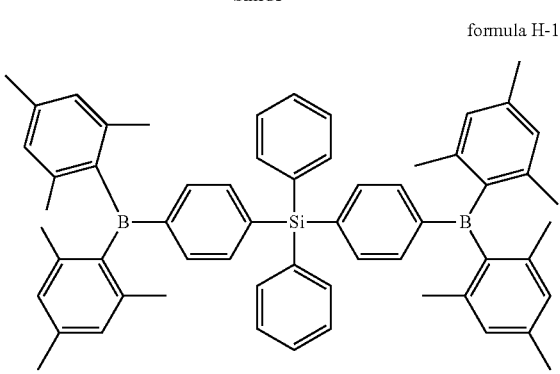

formula H-20

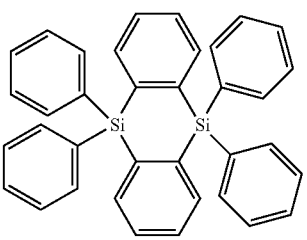

formula H-21

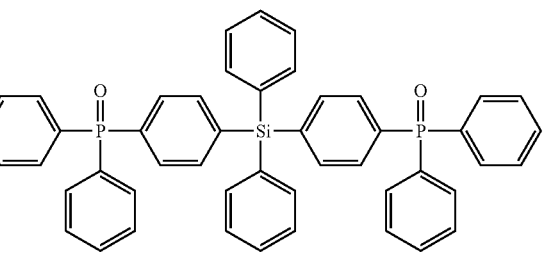

Particularly preferred compounds from group 4 for the preparation of the matrix for phosphorescent dopants are disclosed, inter alia, in DE 102009022858, DE 102009023155, EP 652273 B1, WO 2007/063754 and WO 2008/056746, where particularly preferred compounds are described by the formulae H-22 to H-25.

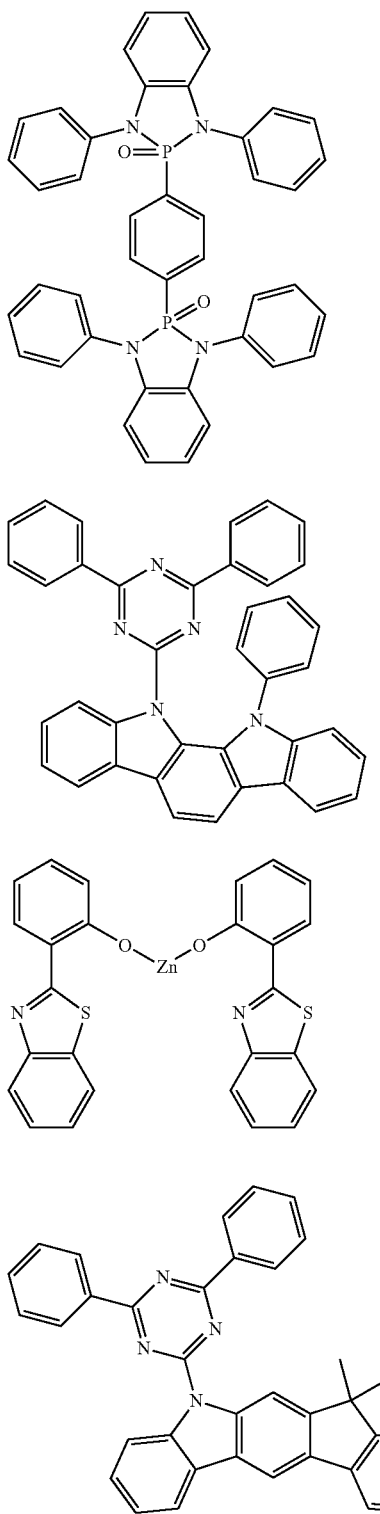

formula H-22 formula H-23 formula H-24 formula H-25

With respect to the functional compounds which can be employed in accordance with the invention and which can serve as host material, especial preference is given to substances which contain at least one nitrogen atom. These preferably include aromatic amines, triazine derivatives and carbazole derivatives. Thus, carbazole derivatives in particular exhibit surprisingly high efficiency. Triazine derivatives result in unexpectedly long lifetimes of the electronic devices.

It may also be preferred to employ a plurality of different matrix materials as a mixture, in particular at least one electron-conducting matrix material and at least one hole-conducting matrix material. Preference is likewise given to the use of a mixture of a charge-transporting matrix material and an electrically inert matrix material which is not in involved in the charge transport to a significant extent, if at all, as described, for example, in WO 2010/108579.

It is furthermore possible to employ compounds which improve the transition from the singlet state to the triplet state and which, employed in support of the functional compounds having emitter properties, improve the phosphorescence properties of these compounds. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Furthermore, the inks may comprise a wide-band-gap material as functional material. Wide-band-gap material is taken to mean a material in the sense of the disclosure content of U.S. Pat. No. 7,294,849. These systems exhibit particularly advantageous performance data in electroluminescent devices.

The compound employed as wide-band-gap material can preferably have a band gap of 2.5 eV or more, more preferably 3.0 eV or more, and most preferably 3.5 eV or more. The band gap can be calculated, inter alia, by means of the energy levels of the highest occupied molecular orbital (HOMO) and the lowest unoccupied molecular orbital (LUMO).

Furthermore, the inks may comprise a hole-blocking material (HBM) as functional material. A hole-blocking material denotes a material which prevents or minimises the transmission of holes (positive charges) in a multilayer system, in particular if this material is arranged in the form of a layer adjacent to an emission layer or a hole-conducting layer. In general, a hole-blocking material has a lower HOMO level than the hole-transport material in the adjacent layer. Hole-blocking layers are frequently arranged between the light-emitting layer and the electron-transport layer in OLEDs.

It is basically possible to employ any known hole-blocking material. In addition to other hole-blocking materials described elsewhere in the present application, advantageous hole-blocking materials are metal complexes (US 2003/0068528), such as, for example, bis(2-methyl-8-quinolinolato)(4-phenylphenolato)aluminium(III) (BAlQ). Fac-tris(1-phenylpyrazolato-N,C2)-iridium(III) (Ir(ppz)$_3$) is likewise employed for this purpose (US 2003/0175553 A1). Phenanthroline derivatives, such as, for example, BCP, or phthalimides, such as, for example, TMPP, can likewise be employed.

Furthermore, advantageous hole-blocking materials are described in WO 00/70655 A2, WO 01/41512 and WO 01/93642 A1.

Furthermore, the inks may comprise an electron-blocking material (EBM) as functional material. An electron-blocking material denotes a material which prevents or minimises the transmission of electrons in a multilayer system, in particular if this material is arranged in the form of a layer adjacent to an emission layer or an electron-conducting layer. In general, an electron-blocking material has a higher LUMO level than the electron-transport material in the adjacent layer.

It is basically possible to employ any known electron-blocking material. In addition to other electron-blocking materials described elsewhere in the present application, advantageous electron-blocking materials are transition-metal complexes, such as, for example, Ir(ppz)$_3$ (US 2003/0175553).

The electron-blocking material can preferably be selected from amines, triarylamines and derivatives thereof.

Furthermore, the functional compounds which can be employed as organic functional materials in the inks preferably have, if they are low-molecular-weight compounds, a molecular weight of ≤5,000 g/mol, preferably ≤3,000 g/mol, more preferably ≤2,000 g/mol and most preferably ≤1,800 g/mol.

Of particular interest are furthermore functional compounds which are distinguished by a high glass-transition temperature. In this connection, particularly preferred functional compounds which can be employed as organic functional material in the inks are those which have a glass-transition temperature of ≥70° C., preferably ≥100° C., more preferably ≥125° C. and most preferably ≥150° C., determined in accordance with DIN 51005 (Version 2005-08).

The inks may also comprise polymers as organic functional materials. The compounds described above as organic functional materials, which frequently have a relatively low molecular weight, can also be mixed with a polymer. It is likewise possible to incorporate these compounds covalently into a polymer. This is possible, in particular, with compounds which are substituted by reactive leaving groups, such as bromine, iodine, chlorine, boronic acid or boronic acid ester, or by reactive, polymerisable groups, such as olefins or oxetanes. These can be used as monomers for the production of corresponding oligomers, dendrimers or polymers. The oligomerisation or polymerisation here preferably takes place via the halogen functionality or the boronic acid functionality or via the polymerisable group. It is furthermore possible to crosslink the polymers via groups of this type. The compounds and polymers useful for the invention can be employed as crosslinked or uncrosslinked layer.

Polymers which can be employed as organic functional materials frequently contain units or structural elements which have been described in the context of the compounds described above, inter alia those as disclosed and extensively listed in WO 02/077060 A1, in WO 2005/014689 A2 and in WO 2011/076314 A1. These are incorporated into the present application by way of reference. The functional materials can originate, for example, from the following classes:

Group 1: structural elements which are able to generate hole-injection and/or hole-transport properties;
Group 2: structural elements which are able to generate electron-injection and/or electron-transport properties;
Group 3: structural elements which combine the properties described in relation to groups 1 and 2;
Group 4: structural elements which have light-emitting properties, in particular phosphorescent groups;
Group 5: structural elements which improve the transition from the so-called singlet state to the triplet state;
Group 6: structural elements which influence the morphology or also the emission colour of the resultant polymers;
Group 7: structural elements which are typically used as backbone.

The structural elements here may also have various functions, so that a clear assignment need not be advantageous. For example, a structural element of group 1 may likewise serve as backbone.

The polymer having hole-transport or hole-injection properties employed as organic functional material, containing structural elements from group 1, may preferably contain units which correspond to the hole-transport or hole-injection materials described above.

Further preferred structural elements of group 1 are, for example, triarylamine, benzidine, tetraaryl-para-phenylene-diamine, carbazole, azulene, thiophene, pyrrole and furan derivatives and further O-, S- or N-containing heterocycles having a high HOMO. These arylamines and heterocycles preferably have an HOMO of above −5.8 eV (against vacuum level), more preferably above −5.5 eV.

Preference is given, inter alia, to polymers having hole-transport or hole-injection properties, containing at least one of the following recurring units of the formula HTP-1:

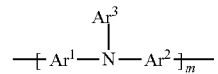

HTP-1 in which the symbols have the following meaning:

Ar$^1$ is, in each case identically or differently for different recurring units, a single bond or a monocyclic or polycyclic aryl group, which may optionally be substituted;

A$^2$ is, in each case identically or differently for different recurring units, a monocyclic or polycyclic aryl group, which may optionally be substituted;

Ar$^3$ is, in each case identically or differently for different recurring units, a monocyclic or polycyclic aryl group, which may optionally be substituted;

m is 1, 2 or 3.

Particular preference is given to recurring units of the formula HTP-1 which are selected from the group consisting of units of the formulae HTP-1A to HTP-1C:

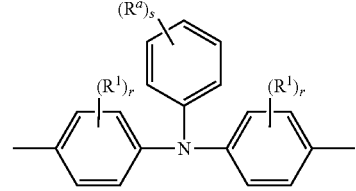

HTP-1A

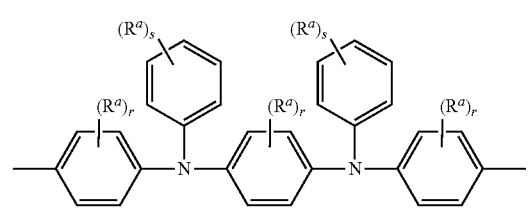

HTP-1B

-continued

HTP-1C

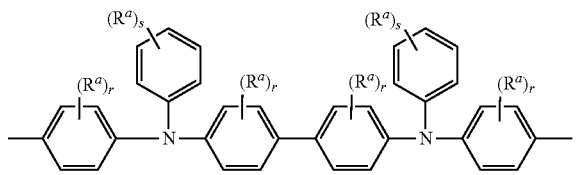

in which the symbols have the following meaning:

$R^a$ is on each occurrence, identically or differently, H, a substituted or unsubstituted aromatic or heteroaromatic group, an alkyl, cycloalkyl, alkoxy, aralkyl, aryloxy, arylthio, alkoxycarbonyl, silyl or carboxyl group, a halogen atom, a cyano group, a nitro group or a hydroxyl group;

r is 0, 1, 2, 3 or 4, and s is 0, 1, 2, 3, 4 or 5.

Preference is given, inter alia, to polymers having hole-transport or hole-injection properties, containing at least one of the following recurring units of the formula HTP-2:

HTP-2 in which the symbols have the following meaning:

$T^1$ and $T^2$ are selected independently from thiophene, selenophene, thieno-[2,3-b]thiophene, thieno[3,2-b]thiophene, dithienothiophene, pyrrole and aniline, where these groups may be substituted by one or more radicals Rb;

$R^b$ is selected independently on each occurrence from halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, an optionally substituted silyl, carbyl or hydrocarbyl group having 1 to 40 carbon atoms, which may optionally be substituted and may optionally contain one or more heteroatoms;

$R^0$ and $R^{00}$ are each independently H or an optionally substituted carbyl or hydrocarbyl group having 1 to 40 carbon atoms, which may optionally be substituted and may optionally contain one or more heteroatoms;

$Ar^7$ and $Ar^8$ represent, independently of one another, a monocyclic or polycyclic aryl or heteroaryl group, which may optionally be substituted and may optionally be bonded to the 2,3-position of one or both adjacent thiophene or selenophene groups;

c and e are, independently of one another, 0, 1, 2, 3 or 4, where 1<c+e≤6;

d and f are, independently of one another, 0, 1, 2, 3 or 4.

Preferred examples of polymers having hole-transport or hole-injection properties are described, inter alia, in WO 2007/131582 A1 and WO 2008/009343 A1.

The polymer having electron-injection and/or electron-transport properties employed as organic functional material, containing structural elements from group 2, may preferably contain units which correspond to the electron-injection and/or electron-transport materials described above.

Further preferred structural elements of group 2 which have electron-injection and/or electron-transport properties are derived, for example, from pyridine, pyrimidine, pyridazine, pyrazine, oxadiazole, quinoline, quinoxaline and phenazine groups, but also triarylborane groups or further O-, S- or N-containing heterocycles having a low LUMO level. These structural elements of group 2 preferably have an LUMO of below −2.7 eV (against vacuum level), more preferably below −2.8 eV.

The organic functional material can preferably be a polymer which contains structural elements from group 3, where structural elements which improve the hole and electron mobility (i.e. structural elements from groups 1 and 2) are connected directly to one another. Some of these structural elements can serve as emitters here, where the emission colours may be shifted, for example, into the green, red or yellow. Their use is therefore advantageous, for example, for the generation of other emission colours or a broad-band emission by polymers which originally emit in blue.

The polymer having light-emitting properties employed as organic functional material, containing structural elements from group 4, may preferably contain units which correspond to the emitter materials described above. Preference is given here to polymers containing phosphorescent groups, in particular the emitting metal complexes described above which contain corresponding units containing elements from groups 8 to 10 (Ru, Os, Rh, Ir, Pd, Pt).

The polymer employed as organic functional material containing units of group 5 which improve the transition from the so-called singlet state to the triplet state can preferably be employed in support of phosphorescent compounds, preferably the polymers containing structural elements of group 4 described above. A polymeric triplet matrix can be used here.

Suitable for this purpose are, in particular, carbazole and connected carbazole dimer units, as described, for example, in DE 10304819 A1 and DE 10328627 A1. Also suitable for this purpose are ketone, phosphine oxide, sulfoxide, sulfone and silane derivatives and similar compounds, as described, for example, in DE 10349033 A1. Furthermore, preferred structural units can be derived from compounds which have been described above in connection with the matrix materials employed together with phosphorescent compounds.

The further organic functional material is preferably a polymer containing units of group 6 which influence the morphology and/or the emission colour of the polymers. Besides the polymers mentioned above, these are those which have at least one further aromatic or another conjugated structure which do not count amongst the above-mentioned groups. These groups accordingly have only little or no effect on the charge-carrier mobilities, the non-organometallic complexes or the singlet-triplet transition.

The polymers may also include cross-linkable groups such as styrene, benzocyclobutene, epoxide and oxetane moieties.

Structural units of this type are able to influence the morphology and/or the emission colour of the resultant polymers. Depending on the structural unit, these polymers can therefore also be used as emitters.

In the case of fluorescent OLEDs, preference is therefore given to aromatic structural elements having 6 to 40 C atoms or also tolan, stilbene or bisstyrylarylene derivative units, each of which may be substituted by one or more radicals. Particular preference is given here to the use of groups derived from 1,4-phenylene, 1,4-naphthylene, 1,4- or 9,10-anthrylene, 1,6-, 2,7- or 4,9-pyrenylene, 3,9- or 3,10-perylenylene, 4,4'-biphenylene, 4,4''-terphenylylene, 4,4'-bi-1,1'-naphthylylene, 4,4'-tolanylene, 4,4'-stilbenylene or 4,4''-bisstyrylarylene derivatives.

The polymer employed as organic functional material preferably contains units of group 7, which preferably contain aromatic structures having 6 to 40 C atoms which are frequently used as backbone.

These include, inter alia, 4,5-dihydropyrene derivatives, 4,5,9,10-tetra-hydropyrene derivatives, fluorene derivatives, which are disclosed, for example, in U.S. Pat. No. 5,962, 631, WO 2006/052457 A2 and WO 2006/118345 A1, 9,9-spirobifluorene derivatives, which are disclosed, for example, in WO 2003/020790 A1, 9,10-phenanthrene derivatives, which are disclosed, for example, in WO 2005/104264 A1, 9,10-dihydrophenanthrene derivatives, which are disclosed, for example, in WO 2005/014689 A2, 5,7-dihydrodibenzoxepine derivatives and cis- and trans-indenofluorene derivatives, which are disclosed, for example, in WO 2004/041901 A1 and WO 2004/113412 A2, and binaphthylene derivatives, which are disclosed, for example, in WO 2006/063852 A1, and further units which are disclosed, for example, in WO 2005/056633 A1, EP 1344788 A1, WO 2007/043495 A1, WO 2005/033174 A1, WO 2003/099901 A1 and DE 102006003710.

Particular preference is given to structural units of group 7 which are selected from fluorene derivatives, which are disclosed, for example, in U.S. Pat. No. 5,962,631, WO 2006/052457 A2 and WO 2006/118345 A1, spiro-bifluorene derivatives, which are disclosed, for example, in WO 2003/020790 A1, benzofluorene, dibenzofluorene, benzothiophene and dibenzo-fluorene groups and derivatives thereof, which are disclosed, for example, in WO 2005/056633 A1, EP 1344788 A1 and WO 2007/043495 A1.

Especially preferred structural elements of group 7 are represented by the general formula PB-1:

formula PB-1

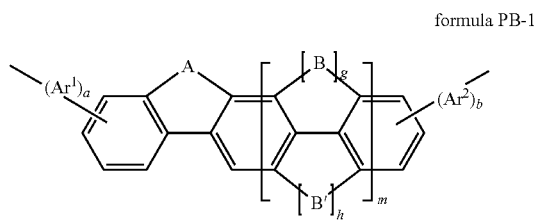

in which the symbols and indices have the following meanings:

A, B and B' are each, also for different recurring units, identically or differently, a divalent group, which is preferably selected from —CR$^c$R$^d$—, —NR$^c$—, —PR$^c$—, —O—, —S—, —SO—, —SO$_2$—, —CO—, —CS—, —CSe—, —P(=O)R$^c$—, —P(=S)R$^c$—, and —SiR$^c$R$^d$—;

R$^c$ and R$^d$ are selected on each occurrence, independently, from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, an optionally substituted silyl, carbyl or hydrocarbyl group having 1 to 40 carbon atoms, which may optionally be substituted and may optionally contain one or more heteroatoms, where the groups R$^c$ and R$^d$ may optionally form a spiro group with a fluorene radical to which they are bonded; X is halogen;

R$^0$ and R$^{00}$ are each, independently, H or an optionally substituted carbyl or hydrocarbyl group having 1 to 40 carbon atoms, which may optionally be substituted and may optionally contain one or more heteroatoms;

g is in each case, independently, 0 or 1 and h is in each case, independently, 0 or 1, where the sum of g and h in a sub-unit is preferably 1;

m is an integer 1;

Ar$^1$ and Ar$^2$ represent, independently of one another, a monocyclic or polycyclic aryl or heteroaryl group, which may optionally be substituted and may optionally be bonded to the 7,8-position or the 8,9-position of an indenofluorene group;

a and b are, independently of one another, 0 or 1.

If the groups R$^c$ and R$^d$ form a spiro group with the fluorene group to which these groups are bonded, this group preferably represents a spiro-bifluorene.

Particular preference is given to recurring units of the formula PB-1 which are selected from the group consisting of units of the formulae PB-1A to PB-1E:

formula PB-1A

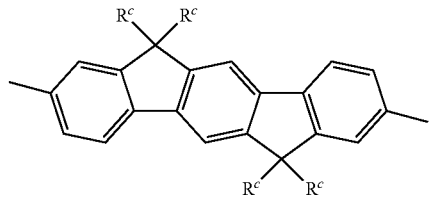

formula PB-1B

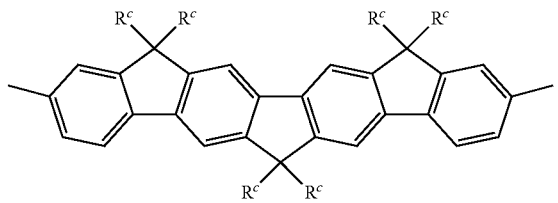

formula PB-1C

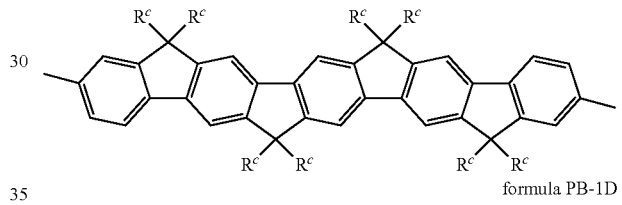

formula PB-1D

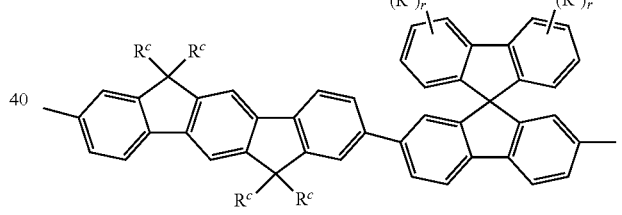

formula PB-1E

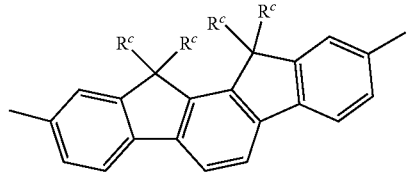

where R$^c$ has the meaning described above for formula PB-1, r is 0, 1, 2, 3 or 4, and R$^e$ has the same meaning as the radical R$^c$.

R$^e$ is preferably —F, —Cl, —Br, —I, —CN, —NO$_2$, —NCO, —NCS, -OCN, —SCN, —C(=O)NR$^0$R$^{00}$, —C(=O)X, —C(=O)R$^0$, —NR$^0$R$^{00}$, an optionally substituted silyl, aryl or heteroaryl group having 4 to 40, preferably 6 to 20, C atoms, or a straight-chain, branched or cyclic alkyl, alkoxy, alkylcarbonyl, alkoxycarbonyl, alkylcarbonyloxy or alkoxycarbonyloxy group having 1 to 20, preferably 1 to 12, C atoms, where one or more hydrogen atoms may optionally be substituted by F or Cl, and the groups R$^0$, R$^{00}$ and X have the meaning described above for formula PB-1.

Particular preference is given to recurring units of the formula PB-1 which are selected from the group consisting of units of the formulae PB-1F to PB-1I:

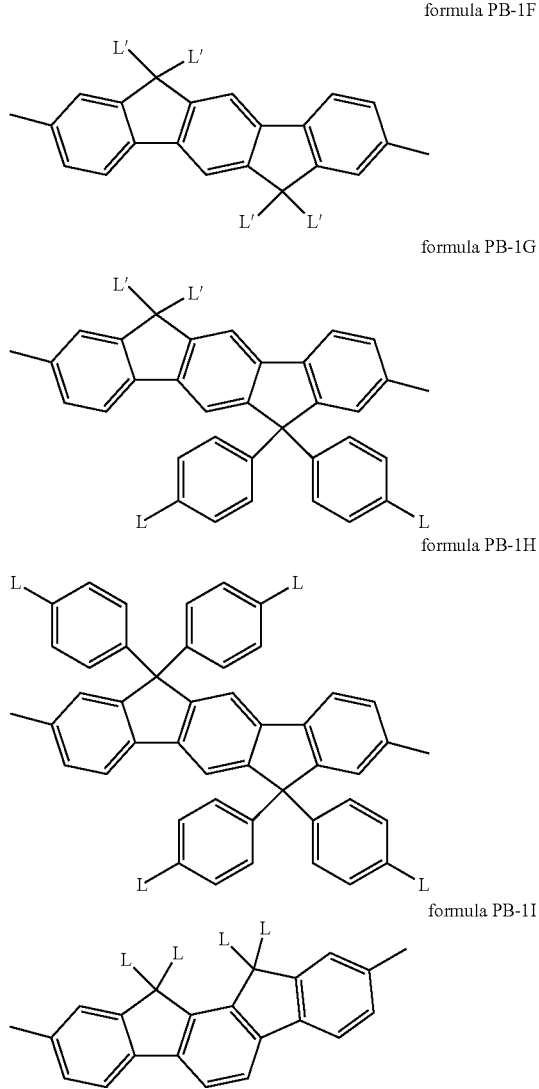

formula PB-1F formula PB-1G formula PB-1H formula PB-1I in which the symbols have the following meaning:

L is H, halogen or an optionally fluorinated, linear or branched alkyl or alkoxy group having 1 to 12 C atoms and preferably stands for H, F, methyl, i-propyl, t-butyl, n-pentoxy or trifluoromethyl; and L' is an optionally fluorinated, linear or branched alkyl or alkoxy group having 1 to 12 C atoms and preferably stands for n-octyl or n-octyloxy.

For carrying out the present invention, preference is given to polymers which contain more than one of the structural elements of groups 1 to 7 described above. It may furthermore be provided that the polymers preferably contain more than one of the structural elements from one group described above, i.e. comprise mixtures of structural elements selected from one group.

Particular preference is given, in particular, to polymers which, besides at least one structural element which has light-emitting properties (group 4), preferably at least one phosphorescent group, additionally contain at least one further structural element of groups 1 to 3, 5 or 6 described above, where these are preferably selected from groups 1 to 3.

The proportion of the various classes of groups, if present in the polymer, can be in broad ranges, where these are known to the person skilled in the art. Surprising advantages can be achieved if the proportion of one class present in a polymer, which is in each case selected from the structural elements of groups 1 to 7 described above, is preferably in each case ≥5 mol %, more preferably in each case ≥10 mol %.

The preparation of white-emitting copolymers is described in detail, inter alia, in DE 10343606 A1.

In order to improve the solubility, the polymers may contain corresponding groups. It may preferably be provided that the polymers contain substituents, so that on average at least 2 non-aromatic carbon atoms, particularly preferably at least 4 and especially preferably at least 8 non-aromatic carbon atoms are present per recurring unit, where the average relates to the number average. Individual carbon atoms here may be replaced, for example, by O or S. However, it is possible for a certain proportion, optionally all recurring units, to contain no substituents which contain non-aromatic carbon atoms. Short-chain substituents are preferred here, since long-chain substituents can have adverse effects on layers which can be obtained using organic functional materials. The substituents preferably contain at most 12 carbon atoms, preferably at most 8 carbon atoms and particularly preferably at most 6 carbon atoms in a linear chain.

The polymer employed in accordance with the invention as organic functional material can be a random, alternating or regioregular copolymer, a block copolymer or a combination of these copolymer forms.

In a further embodiment, the polymer employed as organic functional material can be a non-conjugated polymer having side chains, where this embodiment is particularly important for phosphorescent OLEDs based on polymers. In general, phosphorescent polymers can be obtained by free-radical copolymerisation of vinyl compounds, where these vinyl compounds contain at least one unit having a phosphorescent emitter and/or at least one charge-transport unit, as is disclosed, inter alia, in U.S. Pat. No. 7,250,226 B2. Further phosphorescent polymers are described, inter alia, in JP 2007/211243 A2, JP 2007/197574 A2, U.S. Pat. No. 7,250,226 B2 and JP 2007/059939 A.

In a further preferred embodiment, the non-conjugated polymers contain backbone units, which are connected to one another by spacer units. Examples of such triplet emitters which are based on non-conjugated polymers based on backbone units are disclosed, for example, in DE 102009023154.

In a further preferred embodiment, the non-conjugated polymer can be designed as fluorescent emitter. Preferred fluorescent emitters which are based on non-conjugated polymers having side chains contain anthracene or benzanthracene groups or derivatives of these groups in the side chain, where these polymers are disclosed, for example, in JP 2005/108556, JP 2005/285661 and JP 2003/338375.

These polymers can frequently be employed as electron- or hole-transport materials, where these polymers are preferably designed as non-conjugated polymers.

Furthermore, the functional compounds employed as organic functional materials in the inks preferably have, in the case of polymeric compounds, a molecular weight $M_w$ of ≥10,000 g/mol, more preferably ≥20,000 g/mol and most preferably ≥50,000 g/mol.

The molecular weight $M_w$ of the polymers here is preferably in the range from 10,000 to 2,000,000 g/mol, more preferably in the range from 20,000 to 1,000,000 g/mol and most preferably in the range from 50,000 to 300,000 g/mol. The molecular weight $M_w$ is determined by means of GPC (=gel permeation chromatography) against an internal polystyrene standard.

The publications cited above for description of the functional compounds are incorporated into the present application by way of reference for disclosure purposes.

The inks useful for the invention may comprise all organic functional materials which are necessary for the production of the respective functional layer of the electronic device. If, for example, a hole-transport, hole-injection, electron-transport or electron-injection layer is built up precisely from one functional compound, the ink comprises precisely this compound as organic functional material. If an emission layer comprises, for example, an emitter in combination with a matrix or host material, the ink comprises, as organic functional material, precisely the mixture of emitter and matrix or host material, as described in greater detail elsewhere in the present application.

Besides the said components, the ink useful for the invention may comprise further additives and processing assistants. These include, inter alia, surface-active substances (surfactants), lubricants and greases, additives which modify the viscosity, additives which increase the conductivity, dispersants, hydrophobicising agents, adhesion promoters, flow improvers, antifoams, deaerating agents, diluents, which may be reactive or unreactive, fillers, assistants, processing assistants, dyes, pigments, stabilisers, sensitisers, nanoparticles and inhibitors.

Preference is furthermore also given to solutions of non-conducting, electronically inert polymers (matrix polymers; inert polymeric binders) which comprise admixed low-molecular-weight, oligomeric, dendritic, linear or branched and/or polymeric organic and/or organometallic semiconductors. Preferably, the ink may comprise 0.1 to 10% by weight, more preferably 0.25 to 5% by weight and most preferably 0.3 to 3% by weight inert polymeric binders, based on the total weight of the ink.

Improvements can be achieved with volatile wetting agents. The term "volatile" as used above and below means that the agent can be removed from the organic semiconducting materials by evaporation, after these materials have been deposited onto a substrate of an OE device, under conditions (like temperature and/or reduced pressure) that do not significantly damage these materials or the OE device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure. Preferably, the wetting agents are not capable of chemically reacting with the functional materials. In particular they are selected from compounds that do not have a permanent doping effect on the functional materials (e.g. by oxidising or otherwise chemically reacting with the functional materials). Therefore, the ink preferably should not contain additives, like e.g. oxidants or protonic or lewis acids, which react with the functional materials by forming ionic products.

Positive effects can be accomplished by inks comprising volatile components having similar boiling points. Preferably, the difference of the boiling point of the wetting agent and the first organic solvent is in the range of –100° C. to 100° C., more preferably in the range of –70° C. to 70° C. and most preferably in the range of –50° C. to 50° C. If a mixture of two or more first organic solvents is used meeting the requirements as mentioned above in connection with the description of the first organic solvent, the boiling point of the lowest boiling first organic solvent is deciding.

Preferred wetting agents can be aromatic or non-aromatic compounds. With further preference the wetting agents are non-ionic compounds. Particular useful wetting agents comprise a surface tension of at most 35 mN/m, preferably of at most 30 mN/m, and more preferably of at most 25 mN/m. The surface tension can be measured using a FTA (First Ten Angstrom) 1000 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, more preferably at least 5 mN/m and most preferably at least 10 mN/m.

Improvements can be achieved by wetting agents comprising a molecular weight of at least 100 g/mol, preferably at least 150 g/mol, more preferably at least 180 g/mol and most preferably at least 200 g/mol.

Suitable and preferred wetting agents that do not oxidise or otherwise chemically react with the organic functional materials, preferably organic semiconductor materials, are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from cyclic siloxanes and methyl siloxanes having 6 to 20 carbon atoms, especially 8 to 16 carbon atoms; $C_7$-$C_{14}$ alkanes, $C_7$-$C_{14}$ alkenes, $C_7$-$C_{14}$ alkynes, alcohols having 7 to 14 carbon atoms, fluoro ethers having 7 to 14 carbon atoms, fluoro esters having 7 to 14 carbon atoms and fluoro ketones having 7 to 14 carbon atoms. Most preferred wetting agents are cyclic siloxanes and methyl siloxanes having 8 to 14 carbon atoms.

Useful and preferred alkanes having 7 to 14 carbon atoms include heptane, octane, nonane, decane, undecane, dodecane, tridecane, tetradecane, 3-methyl heptane, 4-ethyl heptane, 5-propyl decane, trimethyl cyclohexane and decalin.

Halogenated alkanes having 7 to 14 carbon atoms include 1-chloro heptane, 1,2-dichloro octane, tetrafluoro octane, decafluoro dodecane, perfluoro nonane, 1,1,1-trifluoromethyl decane, and perfluoro methyl decalin.

Useful and preferred alkenes having 7 to 14 carbon atoms include heptene, octene, nonene, 1-decene, 4-decene, undecene, dodecene, tridecene, tetradecene, 3-methyl heptene, 4-ethyl heptene, 5-propyl decene, and trimethyl cyclohexene.

Halogenated alkenes having 7 to 14 carbon atoms include 1,2-dichloro octene, tetrafluoro octene, decafluoro dodecene, perfluoro nonene, and 1,1,1-trifluoromethyl decene.

Useful and preferred alkynes having 7 to 14 carbon atoms include octyne, nonyne, 1-decyne, 4-decyne, dodecyne, tetradecyne, 3-methyl heptyne, 4-ethyl heptyne, 5-propyl decyne, and trimethyl cyclohexyne.

Halogenated alkynes having 7 to 14 carbon atoms include 1,2-dichloro octyne, tetrafluoro octyne, decafluoro dodecyne, perfluoro nonyne, and 1,1,1-trifluoromethyl decyne.

Useful and preferred alcanols having 7 to 14 carbon atoms include, heptanol, octanol, nonanol, decanol, undecanol, dodecanol, tridecanol, tetradecanol, 3-methyl heptanol, 3,5-dimethyl-1-hexyn-3-ol, 4-ethyl heptanol, 5-propyl decanol, trimethyl cyclohexanol and hydroxyl decalin.

Halogenated alkanols having 7 to 14 carbon atoms include 1-chloro heptanol, 1,2-dichloro octanol, tetrafluoro octanol, decafluoro dodecanol, perfluoro nonanol, 1,1,1-trifluoromethyl decanol, and 2-trifluoro methyl-1-hydroxy decalin.

Useful and preferred fluoro ethers having 7 to 14 carbon atoms include 3-ethoxy-1,1,1,2,3,4,4,5,5,6,6,6 dodecafluoro-2-trifluoromethyl-hexane, 3-propoxy-1,1,1,2,3,4,4,5,5,6,6,6 dodecafluoro-2-trifluoromethyl-hexane, and 3-propoxy-1,1,1,2,3,4,4,5,5,5 decafluoro-2-trifluoromethyl-pentane.

Useful and preferred fluoro esters having 7 to 14 carbon atoms include 3-(1,1,1,2,3,4,4,5,5,6,6,6 dodecafluoro-2-trifluoromethyl-hexyl) ethanoate, and 3-(1,1,1,2,3,4,4,5,5,5 decafluoro-2-trifluoromethyl-pentyl) propanoate.

Useful and preferred fluoro ketones having 7 to 14 carbon atoms include 3-(1,1,1,2,3,4,4,5,5,6,6,6 dodecafluoro-2-trifluoromethyl-hexyl) ethyl ketone, and 3-(1,1,1,2,3,4,4,5,5,5 decafluoro-2-trifluoromethyl-pentyl) propyl ketone.

Useful and preferred siloxanes include hexamethyl disiloxane, octamethyl trisiloxane, decamethyl tetrasiloxane, dodecamethyl pentasiloxane, tetradecamethyl hexasiloxane, Octamethylcyclotetrasiloxane (CAS: 556-67-2), Decamethylcyclopentasiloxane (CAS: 541-02-6), Dodecamethylcyclohexasiloxane (CAS: 540-97-6), Tetradecamethylcycloheptasiloxane (CAS: 107-50-6), Hexaethylcyclotrisiloxane (CAS: 2031-79-0), Octaethylcyclotetrasiloxane (CAS: 1451-99-6), 2,4,6,8,10-pentaethyl-2,4,6,8,10-pentamethylcyclopentasiloxane (CAS: 17940-63-5), and 2,4,6-triethyl-2,4,6-trimethylcyclotrisiloxane (CAS: 15901-49-2).

Preferably, the ink may comprise at most 5% by weight, and more preferably at most 2% by weight of wetting additives. Preferably, the ink comprises 0.01 to 5% by weight, more preferably 0.1 to 2% by weight of wetting agent, based on the total weight of the ink.

The ink useful for the present invention can be designed as an emulsion, dispersion or solution. Preferably, the present ink is a solution (homogeneous mixture) comprising no considerable amounts of a second phase.

In a preferred embodiment of the present invention, in a first step a HIL is formed, in a second step a HTL is formed and in a third step a EML is formed wherein the HIL is formed before the HTL and the HTL is formed before the EML.

The inks useful for preparing the functional layers can be applied, for example, by slot-die coating, curtain coating, flood coating, dip coating, spray coating, spin coating, screen printing, relief printing, gravure printing, rotary printing, roller coating, flexographic printing, offset printing or nozzle printing, preferably inkjet printing on a substrate or one of the layers applied to the substrate. Preferably, at least one layer being obtained by depositing an ink is inkjet-printed, more preferably at least two layers being obtained by depositing an ink are inkjet-printed. Inkjet printing is most preferred. Preferably, the inkjet-printed layer comprises a light emitting material and/or a hole-transporting material.

After the application of an ink to a substrate or a functional layer already applied, a drying step can be carried out in order to remove the solvent from the applied, preferably inkjet-printed ink. Preferably, the inks are dried before an annealing step is performed and the drying step is performed under reduced pressure. Preferably, the drying temperature is below 150° C., more preferably below 100° C., even more preferably below 70° C. and most preferably below 40° C.

The drying can preferably be carried out at relatively low temperature such as room temperature and over a relatively long period in order to avoid bubble formation and to obtain a uniform coating. Preferably, the drying is carried out at a pressure in the range from $10^{-6}$ mbar to 1 bar, particularly preferably in the range from $10^{-6}$ mbar to 100 mbar and especially preferably in the range from $10^{-6}$ mbar to 10 mbar. The duration of the drying depends on the degree of drying to be achieved, where small amounts of residual solvents and or other volatile components can optionally be removed at relatively high temperature and in combination with sintering, which is preferably to be carried out.

In a special embodiment, the drying step is preferably followed by an annealing step. Preferably, at least one of the layers is annealed after the drying step, preferably two of the layers are annealed after the drying step.

Preferably, at least one of the annealing temperatures is at least 180° C., more preferably at least 190° C. Preferably, the annealing temperature is at most 260° C., more preferably at most 250° C. Preferably the annealing step is carried out at an elevated temperature in the range from 80 to 300° C., more preferably from 150 to 250° C. and most preferably from 160 to 230° C. The drying and the annealing step can be combined and performed as a single step.

Preferably, an organic electronic device is manufactured having at least one pixel type comprising at least three different layers including a hole injection layer (HIL), a hole transport layer (HTL) and an emission layer (EML). These layers are well known in the prior art and are described above and below.

Preferably, the device having a hole injection layer (HIL), a hole transport layer (HTL) and an emission layer (EML) wherein the HIL, the HTL and the EML of at least one pixel type are obtained by depositing inks wherein the layers are annealed after said depositing steps in a first, second and third annealing step and the difference of the annealing temperature of the first and of the second annealing step is below 35° C., preferably below 30° C., more preferably below 25° C. and the annealing temperature of the third annealing step is no more than 5° C. above the annealing temperature of the first and/or the second annealing step, preferably the annealing temperature of the third annealing step is equal to or below the annealing temperature of the first and the second annealing step, wherein the first annealing step is performed before the second annealing step and the second annealing step is performed before the third annealing step.

It should be noted that the second depositing step is done after the first annealing step but before the second annealing step and the third depositing step is done after the second annealing step.

The difference of the annealing temperature of the first and of the second annealing step being below 35° C., preferably below 30° C., more preferably below 25° C. as mentioned above concerns the absolute value. Therefore, if the annealing temperature of the second annealing step is bigger than the annealing temperature of the first annealing step, the difference of the annealing temperature of the second and of the first annealing step being below 35° C., preferably below 30° C., more preferably below 25° C.

Preferably, an organic electronic device having at least two different pixel types including a first pixel type and a second pixel type is manufactured and the HIL and the HTL of both pixel types and the EML of at least one pixel type are obtained by depositing an ink and at least one layer of both pixel types is deposited by applying an ink at the same time, preferably an organic electronic device having at least three different pixel types is manufactured and the HIL and the HTL of all pixel types and the EML of at least one pixel type are obtained by depositing an ink and at least one layer of all pixel types is deposited by applying an ink at the same time.

The expression "applying an ink at the same time" means that the different inks are provided to the substrate or the layer on which the inks are applied within one step. Preferably, the ink is applied parallel, e.g. by using ink jet technique with two or more printing heads. Especially, no drying is performed between two different inks are applied, if the inks are applied at the same time. Preferably, the at least two the pixel types differ in their colour.

In a special embodiment, the pixel types preferably include a HIL and the ink for obtaining a HIL comprises an organic solvent, preferably the ink for obtaining a HIL comprises at least 50% by weight of one or more organic solvents.

Furthermore, all the pixel types may preferably include a HIL and the HIL of all pixel types is manufactured by depositing an ink, drying and annealing at the same time wherein the annealing step is performed at an annealing temperature T1.

In a preferred embodiment, the EL element preferably has three different pixel types including a first pixel type, a second pixel type and a third pixel type and the HTL of the second pixel type and the third pixel type are manufactured by depositing an ink, drying and annealing at the same time wherein the annealing step is performed at an annealing temperature T2.

In a specific embodiment of the present invention, preferably no ink concerning the first pixel type is deposited while the HTL of the second pixel type is manufactured.

Preferably, the HTL of the first pixel type and the EML of the second pixel type are manufactured by depositing an ink, drying and annealing at the same time wherein the annealing step is performed at an annealing temperature T3.

Preferably the following equations are met:

$T1-T2 \leq 35°$ C., preferably $\leq 30°$ C., more preferably $\leq 25°$ C.;

$T2-T1 \leq 35°$ C., preferably $\leq 30°$ C., more preferably $\leq 25°$ C.;

$T3-T1 \leq 5°$ C., preferably $\leq 0°$ C., more preferably $\leq -5°$ C.;

$T3-T2 \leq 5°$ C., preferably $\leq 0°$ C., more preferably $\leq =5°$ C.

In a preferred embodiment, the annealing temperature of the first depositing step is preferably at least 180° C., more preferably at least 190° C., and most preferably at least 200° C.

In a preferred further embodiment, the annealing temperature of the second depositing step is preferably at least 180° C., more preferably at least 190° C., and most preferably at least 200° C.

Furthermore, the annealing temperature of the third depositing step is preferably at least 120° C., more preferably at least 140° C., even more preferably at least 150° C., and most preferably at least 160° C.

The annealing temperature of the first depositing step is preferably at most 250° C., more preferably at most 240° C., and most preferably at most 230° C.

Specifically, the annealing temperature of the second depositing step is preferably at most 250° C., more preferably at most 240° C., and most preferably at most 230° C.

In a preferred embodiment, the annealing temperature of the third depositing step is preferably at most 200° C., more preferably at most 190° C., and most preferably at most 180° C.

Preferably, the annealing time is in the range of 1 to 60 minutes, more preferably in the range of 10 to 30 minutes. The drying and the annealing step can be combined and performed as a single step.

Preferably, at least one layer is crosslinked during the annealing in the depositing step; more preferably at least two layers are crosslinked during the annealing in the depositing step.

Furthermore, an ink being applied to a layer being previously achieved by a printing process may use orthogonal solvents in order to prevent a dissolution of the layer to which the functional material is applied.

As mentioned above, in the present method the HTL and the EML of at least one pixel type are obtained by depositing inks. Inks are compositions comprising a solvent and at least one functional organic material being useful, e.g. for obtaining a HTL or EML as mentioned above.

It may furthermore be provided that the process is repeated a number of times, with formation of different or identical functional layers. Crosslinking of the functional layer formed can take place here in order to prevent dissolution thereof, as disclosed, for example, in EP 0 637 899 A1.

In a preferred embodiment, the ink deposited is preferably deposited on a substrate or a layer and the contact angle between the ink and the target surface is at most 45°, preferably at most 20°, more preferably at most 15° and most preferably at most 10° determined by measuring the point of intersection between the drop contour and the baseline of the surface at the application temperature, preferably 25° C.

Furthermore, the present invention relates to a kits of inks for performing a method for forming an organic element. The kit of parts includes at least two different inks being designed for achieving a layer of two different pixel and each ink comprises a concentration of a functional material such that the relative difference of the drying time $(t_1-t_2/t_1)$ of both layers being deposited at the same time and being obtained by the two different inks for manufacturing a layer for each pixel is at most 0.5 wherein $t_1$ is the drying time of the layer of one pixel type and $t_2$ is the drying time of the layer of the other pixel type and $t_1$ is greater than or equal to $t_2$. Preferably, the drying time is based on a drying temperature of 25° C. and a reduced pressure below 500 mbar, preferably about 100 mbar.

The present invention also relates to an electronic device obtainable by a method for the production of an electronic device.

In FIG. 1 a schematic view of a preferred device is shown having a blue common layer (BCL) structure. The device comprises a substrate, a cathode which may be provided with an electron injection layer (EIL) and furthermore, the device comprises three pixel types, one pixel type having a blue colour, one pixel type having a green colour and one pixel type having a red colour. All the pixel types have a HIL, a HTL, an emission layer and a electron transport layer (ETL). As shown, all the pixel types are separated and have specific layers such as a hole-injection layer for red (R-HIL), hole-injection layer for green (G-HIL), hole-injection layer for blue (B-HIL), hole transport layer for red (R-HTL), hole transport layer for green (G-HTL), hole transport layer for blue (B-HTL), green emissive layer (G-EML), and red emissive layer (R-EML). The emission layer for the blue pixel is formed as a blue common layer (BCL) which is also provided to the green and red pixel. Preferably, the common blue layer is deposited by a vacuum deposition process as discussed above and below.

Figure 2:
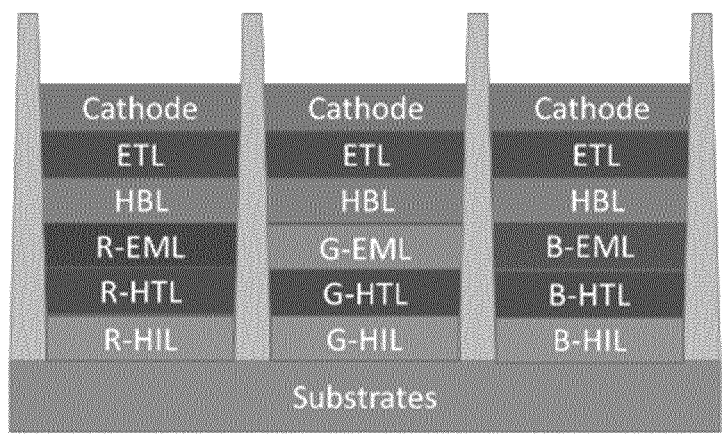
FIG. 2 illustrates a schematic view of a further preferred device having a side-by-side structure.

FIG. 2 shows a schematic view of a further preferred device having a side-by-side structure. The device comprises a substrate, a cathode which may be provided with an electron injection layer (EIL) and furthermore, the device comprises three pixel types, one pixel type having a blue colour, one pixel type having a green colour and one pixel type having a red colour. All the pixel types have a HIL, a HTL, an emission layer and a electron transport layer (ETL). As shown, all the pixel types are separated and have specific layers such as a hole-injection layer for red (R-HIL), hole-injection layer for green (G-HIL), hole-injection layer for blue (B-HIL), hole transport layer for red (R-HTL), hole transport layer for green (G-HTL), hole transport layer for blue (B-HTL), green emissive layer (G-EML), red emissive layer (R-EML) and a blue emissive layer (B-EML).

The present invention furthermore relates to an electronic device having at least one functional layer comprising at least one organic functional material which is obtainable by the above-mentioned method for the production of an electronic device.

An electronic device is taken to mean a device comprising two electrodes and at least one functional layer in between, where this functional layer comprises at least one organic or organometallic compound.

The organic electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), an organic electrical sensor, a light-emitting electrochemical cell (LEC) or an organic laser diode (O-laser).

Active components are generally the organic or inorganic materials which are introduced between the anode and the cathode, where these active components effect, maintain and/or improve the properties of the electronic device, for example its performance and/or its lifetime, for example charge-injection, charge-transport or charge-blocking materials, but in particular emission materials and matrix materials. The organic functional material which can be employed for the production of functional layers of electronic devices accordingly preferably comprises an active component of the electronic device.

Organic electroluminescent devices (OLEDs) are a preferred embodiment of the present invention. The OLED comprises a cathode, an anode and at least one emitting layer.

It is furthermore preferred to employ a mixture of two or more triplet emitters together with a matrix. The triplet emitter having the shorter-wave emission spectrum serves as co-matrix here for the triplet emitter having the longer-wave emission spectrum.

The proportion of the matrix material in the emitting layer in this case is preferably between 50 and 99.9% by volume, more preferably between 80 and 99.5% by volume and most preferably between 92 and 99.5% by volume for fluorescent emitting layers and between 70 and 97% by volume for phosphorescent emitting layers.

Correspondingly, the proportion of the dopant is preferably between 0.1 and 50% by volume, more preferably between 0.5 and 20% by volume and most preferably between 0.5 and 8% by volume for fluorescent emitting layers and between 3 and 15% by volume for phosphorescent emitting layers.

An emitting layer of an organic electroluminescent device may also encompass systems which comprise a plurality of matrix materials (mixed-matrix systems) and/or a plurality of dopants. In this case too, the dopants are generally the materials whose proportion in the system is the smaller and the matrix materials are the materials whose proportion in the system is the greater. In individual cases, however, the proportion of an individual matrix material in the system may be smaller than the proportion of an individual dopant.

The mixed-matrix systems preferably comprise two or three different matrix materials, more preferably two different matrix materials. One of the two materials here is preferably a material having hole-transporting properties or a wide-band-gap material and the other material is a material having electron-transporting properties. However, the desired electron-transporting and hole-transporting properties of the mixed-matrix components may also be combined principally or completely in a single mixed-matrix component, where the further mixed-matrix component(s) fulfil(s) other functions. The two different matrix materials may be present here in a ratio of 1:50 to 1:1, preferably 1:20 to 1:1, more preferably 1:10 to 1:1 and most preferably 1:4 to 1:1. Mixed-matrix systems are preferably employed in phosphorescent organic electroluminescent devices. Further details on mixed-matrix systems can be found, for example, in WO 2010/108579.

Apart from these layers, an organic electroluminescent device may also comprise further layers, for example in each case one or more hole-injection layers, hole-transport layers, hole-blocking layers, electron-transport layers, electron-injection layers, exciton-blocking layers, electron-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. It is possible here for one or more hole-transport layers to be p-doped, for example with metal oxides, such as $MoO_3$ or $WO_3$, or with (per)fluorinated electron-deficient aromatic compounds, and/or for one or more electron-transport layers to be n-doped. It is likewise possible for interlayers, which have, for example, an exciton-blocking function and/or control the charge balance in the electroluminescent device, to be introduced between two emitting layers. However, it should be pointed out that each of these layers does not necessarily have to be present.

The thickness of the layers, for example the hole-transport and/or hole-injection layer, can preferably be in the range from 1 to 500 nm, more preferably in the range from 2 to 200 nm.

In a further embodiment of the present invention, the device comprises a plurality of layers. The ink useful for the invention can preferably be employed here for the production of a hole-transport, hole-injection, electron-transport, electron-injection and/or emission layer.

The present invention accordingly also relates to an electronic device which comprises at least three layers, but in a preferred embodiment all said layers, from hole-injection, hole-transport, emission, electron-transport, electron-injection, charge-blocking and/or charge-generation layer and in which at least one layer has been obtained by means of an ink to be employed in accordance with the present invention.

The device may furthermore comprise layers built up from further low-molecular-weight compounds or polymers which have not been applied by the use of inks. These can also be produced by evaporation of low-molecular-weight compounds in a high vacuum.

It may additionally be preferred to use the compounds to be employed not as the pure substance, but instead as a mixture (blend) together with further polymeric, oligomeric, dendritic or low-molecular-weight substances of any desired type. These may, for example, improve the electronic or emission properties of the layer.

In a preferred embodiment of the present invention, the organic electroluminescent device here may comprise one or more emitting layers. If a plurality of emission layers are present, these preferably have a plurality of emission maxima between 380 nm and 750 nm, resulting overall in white emission, i.e. various emitting compounds which are able to fluoresce or phosphoresce are used in the emitting layers. Very particular preference is given to three-layer systems, where the three layers exhibit blue, green and orange or red emission (for the basic structure see, for example, WO 2005/011013). White-emitting devices are suitable, for example, as backlighting of LCD displays or for general lighting applications.

It is also possible for a plurality of OLEDs to be arranged one above the other, enabling a further increase in efficiency with respect to the light yield to be achieved.

In order to improve the out-coupling of light, the final organic layer on the light-exit side in OLEDs can, for example, also be in the form of a nano-foam, resulting in a reduction in the proportion of total reflection.

In a specific embodiment of the present invention, a common layer is deposited by vacuum deposition technique. Common layer means a layer which is applied for all the different pixel types. Preferably, the common layer being deposited by vacuum deposition technique comprises a light emitting material.

Preference is furthermore given to an OLED in which one or more layers are applied by means of a sublimation process, in which the materials are applied by vapour deposition in vacuum sublimation units at a pressure below $10^{-5}$ mbar, preferably below $10^{-6}$ mbar, more preferably below $10^{-7}$ mbar.

It may furthermore be provided that one or more layers of an electronic device according to the invention are applied by means of the OVPD (organic vapour phase deposition) process or with the aid of carrier-gas sublimation, in which the materials are applied at a pressure between $10^{-5}$ mbar and 1 bar.

It may furthermore be provided that one or more layers of an electronic device according to the invention are produced from solution, such as, for example, by spin coating, or by means of any desired printing process, such as, for example, screen printing, flexographic printing or offset printing, but particularly preferably LITI (light induced thermal imaging, thermal transfer printing) or inkjet printing.

An orthogonal solvent can preferably be used here, which, although dissolving the functional material of a layer to be applied, does not dissolve the layer to which the functional material is applied.

The device usually comprises a cathode and an anode (electrodes). The electrodes (cathode, anode) are selected for the purposes of the present invention in such a way that their band energies correspond as closely as possible to those of the adjacent, organic layers in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO, NaF, etc.). The layer thickness of this layer is preferably between 0.1 and 10 nm, more preferably between 0.2 and 8 nm, and most preferably between 0.5 and 5 nm.

The anode preferably comprises materials having a high work function. The anode preferably has a potential greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to facilitate either irradiation of the organic material (O-SCs) or the coupling-out of light (OLEDs/PLEDs, O-lasers). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, poly(ethylenedioxythiophene) (PEDOT) and polyaniline (PANI) or derivatives of these polymers. It is furthermore preferred for a p-doped hole-transport material to be applied as hole-injection layer to the anode, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO energy, i.e. an HOMO energy with a large negative value.

In general, all materials which are used for the layers in accordance with the prior art can be used in the further layers of the electronic device.

The electronic device is correspondingly structured in a manner known per se, depending on the application, provided with contacts and finally hermetically sealed, since the lifetime of such devices is drastically shortened in the presence of water and/or air.

The inks useful for the invention and the electronic devices, in particular organic electroluminescent devices, obtainable therefrom are distinguished over the prior art by one or more of the following surprising advantages:

1. The electronic devices obtainable using the method according to the present invention exhibit very high stability and a very long lifetime compared with electronic devices obtained using conventional methods.
2. The electronic devices obtainable using the method according to the present invention exhibit a high efficiency, especially a high luminance efficiency and a high external quantum efficiency.

3. The inks useful for the present invention can be processed using conventional methods, so that cost advantages can also be achieved thereby.
4. The organic functional materials employed in the method according to the present invention are not subject to any particular restrictions, enabling the process of the present invention to be employed comprehensively.
5. The layers obtainable using the method of the present invention exhibit excellent quality, in particular with respect to the uniformity of the layer.
6. The inks useful for the present invention can be produced in a very rapid and easy manner using conventional methods, so that cost advantages can also be achieved thereby.

These above-mentioned advantages are not accompanied by an impairment of the other electronic properties.

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not to be regarded merely as part of the embodiments of the present invention. For these features, independent protection can be sought in addition or as an alternative to each invention presently claimed.

The teaching on technical action disclosed in the present invention can be abstracted and combined with other examples.

The invention is explained in greater detail below with reference to working examples, but without being restricted thereby.

WORKING EXAMPLES

Example 1

Figure 4:
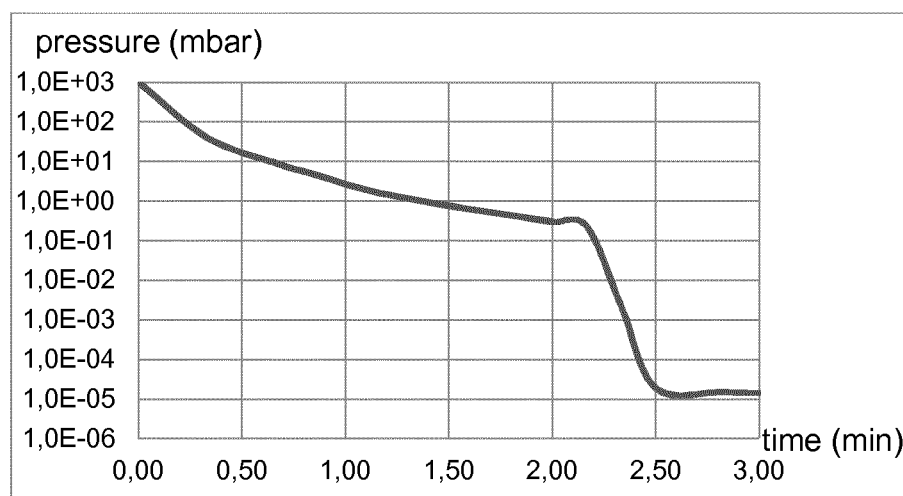
FIG. 4 illustrates the vacuum drying curve in example 1.

The drying delay effect on the film formation (in Pixel A) from adjacent pixel (Pixel B) is revealed. A total drying time varied from 1.5 minutes to 6 minutes and a drying delay time from 1 s to 5 minutes is demonstrated. The solvent system is also described in the table. The vacuum drying curve is shown in FIG. 4. The result of photoluminescence (PL) in pixel A can be seen in Table 1: a delayed drying time of 1 s and 5 s leads to a very uniform film formation (condition 1 and condition 2). It indicates that there is almost no drying delay. On the other hand, a strong drying delay equal to or more than 1 minute causes poor film formation in Pixel A (condition 4 and condition 5). It indicates that the solvent vapor from Pixel B can damage the film in Pixel A when the drying delay is getting longer.

TABLE 1

The ink should dry at similar time, and delay time of the drying of the adjacent pixels should preferably be <1 min, more preferably <30 s.

Figure 3:
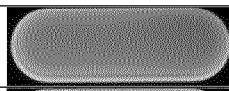
FIGS. 3a-3e illustrates the result of photoluminescence (PL) in pixel A from example 1.
Figure 3:
Figure 3:
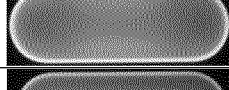
Figure 3:
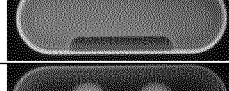
Figure 3:

|  | Total drying time | Drying delay time in Pixel B | PL Pixel A | Solvent A (Volume) | Solvent B (Volume) |
|---|---|---|---|---|---|
| Example 1 | 1.5 min | 1 s | Excellent shown in FIG. 3a | 3-phenoxy toluene (60 pL) | 3-phenoxy toluene (60 pL) |
| Example 2 | 1.5 min | 5 s | Very good shown in FIG. 3b | 3-phenoxy toluene (60 pL) | 3-phenoxy toluene (100 pL) |
| Example 3 | 2 min | 30 s | good shown in FIG. 3c | 3-phenoxy toluene (60 pL) | 3-phenoxy toluene (260 pL) |
| Example 4 | 2.5 min | 1 min | descent shown in FIG. 3d | 3-phenoxy toluene (60 pL) | Diethyl sebacate (260 pL) |
| Comparative Example 1 | 6 min | 5 min | Very poor shown in FIG. 3e | 3-phenoxy toluene (60 pL) | 3-phenoxy toluene/ 1,1-Bis(3,4-dimethylphenyl) ethane (50/50) (360 pL) |

PL = Photoluminescence

Example 2

Study on Green EML

Figure 5:
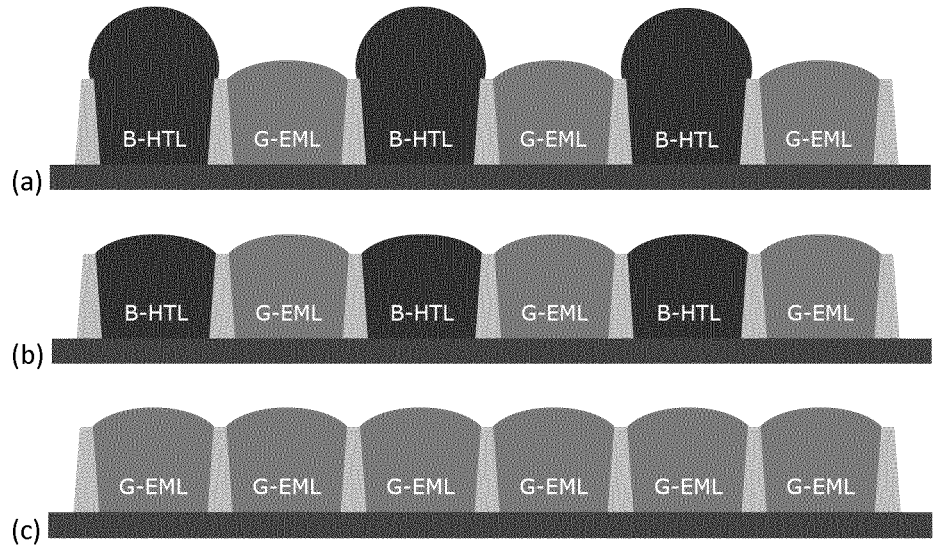
FIG. 5 illustrates a schematic diagram of different ink volumes printed and dried together as mentioned in Example 2.

For BCL structure, G-EML is printed together with B-HTL. B-HTL ink contains HIL-12 in 3-Phenoxytoluene (8 g/L) and G-EML ink contains TH-123:TH-105:DG-T001 (20:50:30) in 3-Phenoxytoluene (16 g/L). Three different conditions have been demonstrated: (a) 160 pL B-HTL ink and 60 pL G-EML were printed, (b) 60 pL for both B-HTL and G-EML, and (c) only G-EML with 60 pL (The adjacent pixel of G-EML is G-EML). The experiment (c) is to clarify if the material in adjacent pixel will effect on the profile. A schematic diagram of each condition can be seen in FIG. 5.

The materials as used in the inks of this example are commercially available products of Merck KGaA.

Figure 6:
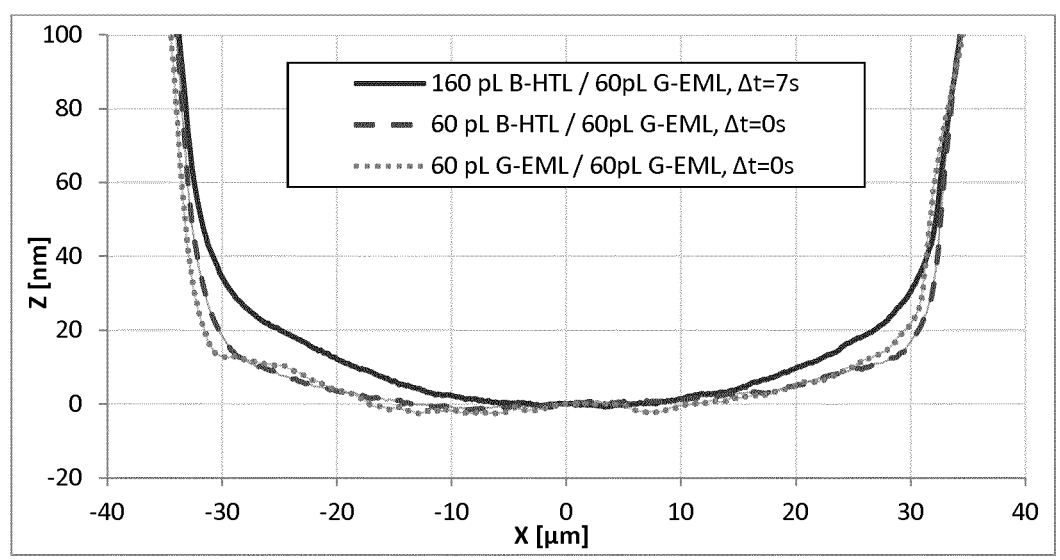
FIG. 6 illustrates the film profile of G-EML of example 2 is much flatter when the ink volume is the same for B-HTL/G-EML (dash line) and G-EML/G-EML (dot line).

The film profile is shown in FIG. 6. The film profile of G-EML is much flatter when the ink volume is the same for B-HTL/G-EML (dash line) and G-EML/G-EML (dot line). It shows no difference of G-EML profile no matter when the adjacent pixel is B-HTL or G-EML. This indicates the film profile is only strongly affected by the ink volume and drying time delay from the adjacent pixels.

Example 3

Study on Red EML

Figure 7:
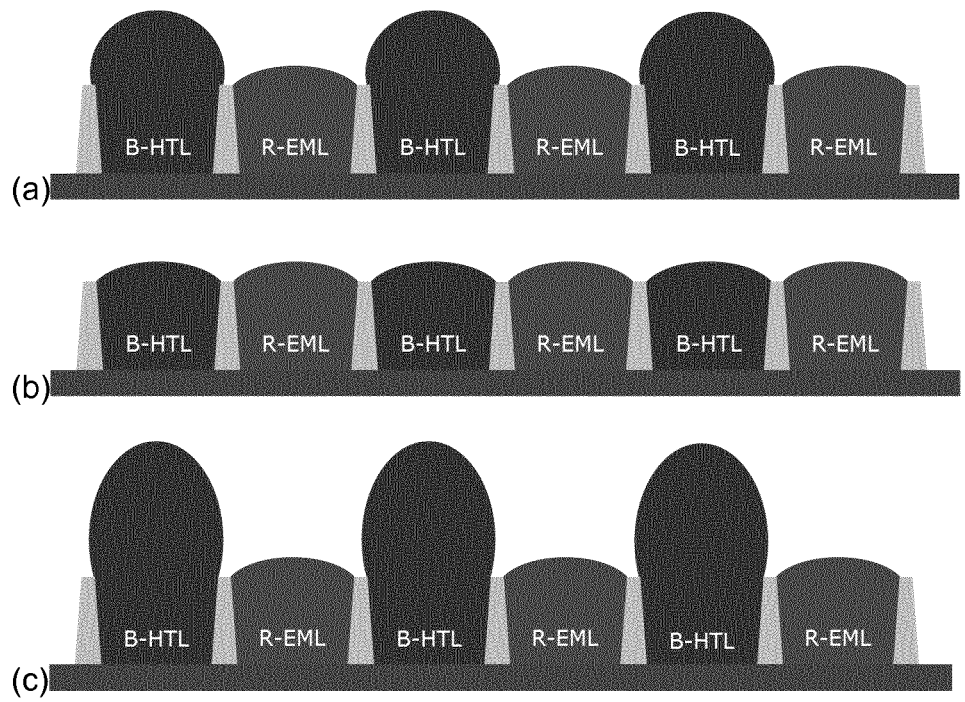
FIG. 7 illustrates a schematic diagram of different ink volumes printed and dried together as mentioned in Example 3.

Furthermore R-EML ink is printed together with B-HTL and dried together. B-HTL contains same materials as in Example 1, and R-EML contains TH-118:TH-102:DG-T001:DR-T058 (30:44:20:6) in 3-Phenoxytoluene (16 g/L). In this example, three conditions have been demonstrated: (a) 160 pL B-HTL ink and 60 pL R-EML, (b) 60 pL B-HTL and 60 pL R-EML, and (c) 260 pL B-HTL ink and 60 pL R-EML. A schematic diagram of each condition can be seen in FIG. 7.

The materials as used in the inks of this example are commercially available products of Merck KGaA.

Figure 8:
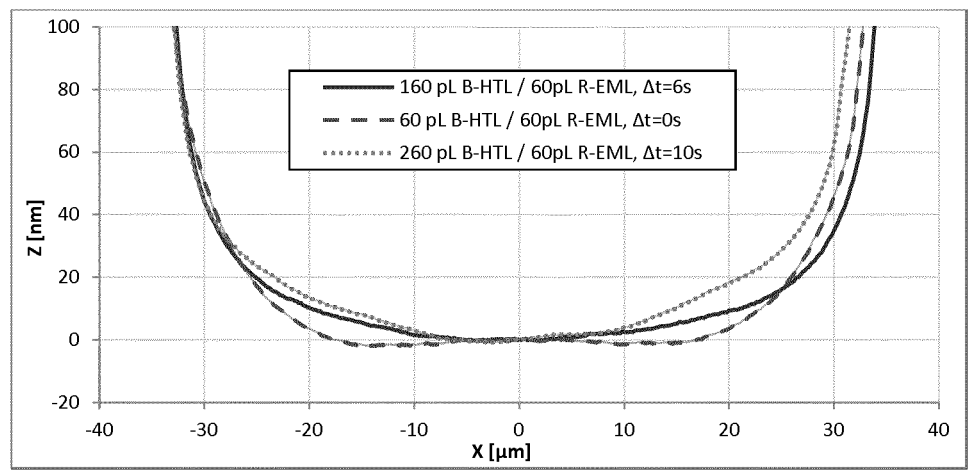
FIG. 8 illustrates the result of film profile of R-EML.

The result of film profile of R-EML can be seen in FIG. 8. As similar trend as G-EML in Example 2, the R-EML shows much flatter when printing the same ink volume as B-HTL. With increasing of ink volume of B-HTL, it is clear that R-EML profile becomes strong U-shape, which is not preferred for good device performance and lifetime. This again indicates the film profile is strongly affected by the ink volume and drying time delay from the adjacent pixels.

The person skilled in the art will be able to use the descriptions to produce further inks and electronic devices according to the present invention without the need to employ inventive skill and thus can carry out the invention throughout the claimed range.

The invention claimed is:

1. A method for forming an organic element of an electronic device having at least two different pixel types including a first pixel type (pixel A) and a second pixel type (pixel B) which comprises depositing at least one layer of the pixel A and one layer of pixel B by applying an ink at the same time, wherein the ink for manufacturing a layer for the pixel A and the ink for manufacturing a layer for the pixel B which are deposited at the same time are different and the layer obtained by depositing the ink for manufacturing a layer for the pixel A and the layer obtained by depositing the ink for manufacturing a layer for the pixel B are dried thereafter, wherein the relative difference of the drying time $(t_1-t_2/t_1)$ of both layers being deposited at the same time and being obtained by two different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$ and wherein the following relation is fulfilled:

$$1/3(A_{pixelB}*T_{pixelB}/C_{inkB}) \leq (A_{pixelA}*T_{pixelA}/C_{inkA}) \leq 3 (A_{pixelB}*T_{pixelB}/C_{inkB})$$

wherein $A_{pixelB}$ is the pixel area of pixel B, $T_{pixelB}$ is the layer thickness in pixel B and $C_{pixelB}$ is the ink concentration for obtaining pixel B, $A_{pixelA}$ is the pixel area of pixel A, $T_{pixelA}$ is the layer thickness in pixel A and $C_{pixelA}$ is the ink concentration for obtaining pixel A each for the layer being dried at the same time.

2. The method for forming an organic element according to claim 1, wherein the relative difference of the drying time $(t_1-t_2/t_1)$ is at most 0.2.

3. The method for forming an organic element according to claim 1, wherein an absolute difference of the drying time $(t_1-t_2)$ is at most 120 seconds, wherein $t_1$ is the drying time of the layer of one pixel type and $t_2$ is the drying time of the layer of the other pixel type and $t_1$ is greater than or equal to $t_2$.

4. The method for forming an organic element according to claim 1, wherein the relative difference of the drying time $(t_1-t_2/t_1)$ is at most 0.02 and the absolute difference of the drying time $(t_1-t_2)$ is at most 1 second wherein $t_1$ is the drying time of the layer of one pixel type and $t_2$ is the drying time of the layer of the other pixel type and $t_1$ is greater than or equal to $t_2$.

5. A method for forming an organic element of an electronic device having at least two different pixel types including a first pixel type (pixel A) and a second pixel type (pixel B) which comprises depositing at least one layer of the pixel A and one layer of pixel B by applying an ink at the same time, wherein the ink for manufacturing a layer for the pixel A and the ink for manufacturing a layer for the pixel B which are deposited at the same time are different and the difference in the inks is based on a functional material comprised by the ink, and the layer obtained by depositing the ink for manufacturing a layer for the pixel A and the layer obtained by depositing the ink for manufacturing a layer for the pixel B are dried thereafter, wherein the relative difference of the drying time $(t_1-t_2/t_1)$ of both layers being deposited at the same time and being obtained by two different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$.

6. The method for forming an organic EL element according to claim claim 1, wherein the following relation is fulfilled:

$$2/3(A_{pixelB}*T_{pixelB}/C_{inkB}) \leq (A_{pixelA}*T_{pixelA}/C_{inkA}) \leq 3/2 (A_{pixelB}*T_{pixelB}/C_{inkB}).$$

7. The method for forming an organic element according to claim 1, wherein the absolute drying time $t_1$ is at most 300 seconds.

8. The method for forming an organic element according to claim 1, wherein the absolute drying time $t_2$ is at most 300 seconds.

9. The method for forming an organic element according to claim 5, wherein the following relation is fulfilled:

$$1/3(A_{pixelB}*T_{pixelB}/C_{inkB}) \leq (A_{pixelA}*T_{pixelA}/C_{inkA}) \leq 3 (A_{pixelB}*T_{pixelB}/C_{inkB})$$

wherein $A_{pixelB}$ is the pixel area of pixel B, $T_{pixelB}$ is the layer thickness in pixel B and $C_{pixelB}$ is the ink concentration for obtaining pixel B, $A_{pixelA}$ is the pixel area of pixel A, $T_{pixelA}$ is the layer thickness in pixel A and $C_{pixelA}$ is the ink concentration for obtaining pixel A each for the layer being dried at the same time.

10. A method for forming an organic element of an electronic device having at least two different pixel types including a first pixel type (pixel A) and a second pixel type (pixel B) which comprises depositing at least one layer of the pixel A and one layer of pixel B by applying an ink at the same time, wherein the ink for manufacturing a layer for the pixel A and the ink for manufacturing a layer for the pixel B which are deposited at the same time are different and the difference in the inks is based on a concentration of a functional material comprised by the ink, and the layer obtained by depositing the ink for manufacturing a layer for the pixel A and the layer obtained by depositing the ink for manufacturing a layer for the pixel B are dried thereafter, wherein the relative difference of the drying time $(t_1-t_2/t_1)$ of both layers being deposited at the same time and being obtained by two different inks for manufacturing a layer for the pixel A and a layer for the pixel B is at most 0.5 wherein $t_1$ is the drying time of the layer of one pixel type and $t_2$ is the drying time of the layer of the other pixel type and $t_1$ is greater than or equal to $t_2$.

11. The method for forming an organic element according to claim 5, wherein the ink for manufacturing a layer for the pixel A and the ink for manufacturing a layer for the pixel B comprises an identical solvent.

12. The method for forming an organic element according to claim 11, wherein the ink for manufacturing a layer for the pixel A and the ink for manufacturing a layer for the pixel B comprises at least 80% by weight of one or more identical solvents.

13. The method for forming an organic element according to claim 1, wherein the ink for manufacturing a layer for the pixel A and the ink for manufacturing a layer for the pixel B which are deposited at the same time are different and the difference in the inks is based on a solvent, wherein the ink for manufacturing a layer of pixel A comprises a solvent A and the ink for manufacturing a layer of pixel B comprises a solvent B.

14. The method for forming an organic element according to claim 1, wherein the ratio of the printing volume $(V^A)$ of the ink for manufacturing a layer for the pixel A to the printing volume $(V^B)$ of the ink for manufacturing a layer for the pixel B $(V^A/V^B)$ is in the range of 1:10 to 10:1.

15. The method for forming an organic element according to claim 1, wherein the ratio of the printing volume $(V^A)$ of the ink for manufacturing a layer for the pixel A to the printing volume $(V^B)$ of the ink for manufacturing a layer for the pixel B $(V^A/V^B)$ is in the range of 2:3 to 3:2.

16. The method for forming an organic element according to claim 1, wherein an organic element having at least three different pixel types is manufactured.

17. The method for forming an organic element according to claim 1, wherein at least one of the layers is annealed after the drying step.

18. The method for forming an organic element according to claim 1, wherein at least one layer of being obtained by depositing an ink is inkjet-printed.

19. Kits of inks for performing the method for forming an organic element according to claim 1, wherein the kit includes at least two different inks being designed for achieving a layer of two different pixel and each ink comprises a concentration of a functional material such that the relative difference of the drying time $(t_1-t_2/t_1)$ of both layers being deposited at the same time and being obtained by the two different inks for manufacturing a layer for each pixel is at most 0.5 wherein $t_1$ is the drying time of the layer of one pixel type and $t_2$ is the drying time of the layer of the other pixel type and $t_1$ is greater than or equal to $t_2$.

20. An electronic device obtainable by the method according to claim 1.

* * * * *